(12) United States Patent
Iwasaki et al.

(10) Patent No.: US 12,065,746 B2
(45) Date of Patent: Aug. 20, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Akihisa Iwasaki, Kyoto (JP); Yasutoshi Okuno, Kyoto (JP); Masaki Inaba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 17/679,174

(22) Filed: Feb. 24, 2022

(65) Prior Publication Data

US 2022/0267909 A1 Aug. 25, 2022

(30) Foreign Application Priority Data

Feb. 25, 2021 (JP) ................................. 2021-028727

(51) Int. Cl.
*C23C 8/80* (2006.01)
*C23C 8/12* (2006.01)
*C23F 1/12* (2006.01)

(52) U.S. Cl.
CPC .................. *C23F 1/12* (2013.01); *C23C 8/12* (2013.01); *C23C 8/80* (2013.01)

(58) Field of Classification Search
None
See application file for complete search history.

(56) References Cited

U.S. PATENT DOCUMENTS

| 9,997,371 | B1 | 6/2018 | Agarwal et al. |
| 10,020,200 | B1 * | 7/2018 | Monahan ................. C23C 14/48 |
| 2002/0175140 | A1 | 11/2002 | Yun et al. .......................... 216/2 |
| 2004/0227153 | A1 | 11/2004 | Hirose et al. .................. 257/192 |
| 2006/0043451 | A1 | 3/2006 | Shea .............................. 257/309 |
| 2008/0083933 | A1 | 4/2008 | Hirose et al. .................. 257/192 |

(Continued)

FOREIGN PATENT DOCUMENTS

| CN | 103258784 A | 8/2013 |
| JP | H7-142404 A | 6/1995 |

(Continued)

*Primary Examiner* — Shamim Ahmed
*Assistant Examiner* — Bradford M Gates
(74) *Attorney, Agent, or Firm* — OSTROLENK FABER LLP

(57) ABSTRACT

A substrate processing method processes a substrate which has a metal layer on a principal surface. The substrate processing method includes a metal oxide layer forming step in which an oxidizing fluid is supplied toward the principal surface of the substrate, thereby forming a metal oxide layer constituted of one atomic layer or several atomic layers on a surface layer of the metal layer and a metal oxide layer removing step in which an etching fluid containing at least one of water in a gaseous state and water in a mist state as well as a reactive gas that reacts with the metal oxide layer together with the water is supplied toward the principal surface of the substrate, thereby etching the metal oxide layer and selectively removing it from the substrate. Then, cycle processing in which the metal oxide layer forming step and the metal oxide layer removing step are given as one cycle is executed at least in one cycle, thereby controlling the etching amount of the metal layer for each cycle at an accuracy of a nanometer or less.

13 Claims, 12 Drawing Sheets

(56) References Cited

U.S. PATENT DOCUMENTS

| | | | |
|---|---|---|---|
| 2013/0217223 A1 | 8/2013 | Stegemann | 438/612 |
| 2018/0254316 A1 | 9/2018 | Tai et al. | |
| 2018/0308695 A1 | 10/2018 | LaVoie et al. | |
| 2019/0055654 A1 | 2/2019 | George et al. | |
| 2019/0096721 A1 | 3/2019 | Iwasaki et al. | |
| 2019/0131130 A1 | 5/2019 | Smith et al. | |
| 2019/0244786 A1 | 8/2019 | Blomberg et al. | |
| 2019/0295870 A1 | 9/2019 | Tapily et al. | |
| 2019/0311909 A1* | 10/2019 | Bajaj | H01L 21/32135 |
| 2019/0368036 A1* | 12/2019 | Kuribayashi | C23C 16/52 |
| 2023/0036221 A1* | 2/2023 | Hino | H01L 29/45 |

FOREIGN PATENT DOCUMENTS

| | | |
|---|---|---|
| JP | 2003-163198 A | 6/2003 |
| JP | 2008-205341 A | 9/2008 |
| JP | 2018-060854 A | 4/2018 |
| JP | 2018-164031 A | 10/2018 |
| JP | 2020-021829 A | 2/2020 |
| KR | 10-2005-0007592 A | 1/2005 |
| KR | 10-2019-0093593 A | 8/2019 |
| TW | 543144 B | 7/2003 |
| TW | 200304673 A | 10/2003 |
| TW | 201834075 A | 9/2018 |
| TW | 201903886 A | 1/2019 |
| TW | 201938831 A | 10/2019 |
| WO | WO 03/105205 A1 | 12/2003 |
| WO | WO 2018/106955 A1 | 6/2018 |

\* cited by examiner

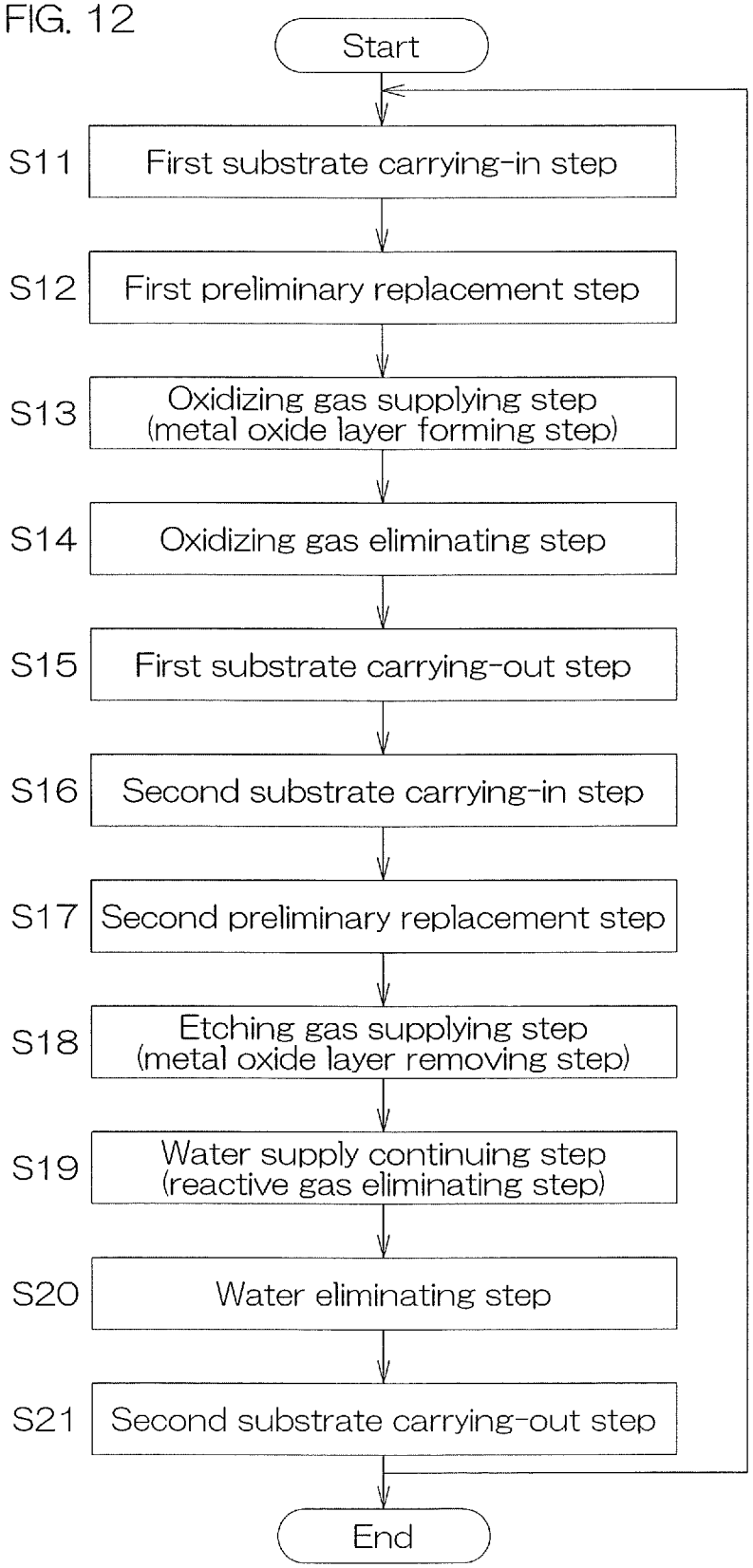

SUBSTRATE PROCESSING METHOD AND SUBSTRATE PROCESSING APPARATUS

CROSS REFERENCE TO RELATED APPLICATIONS

The present application corresponds to Japanese Patent Application No. 2021-28727 filed on Feb. 25, 2021 in the Japan Patent Office, and the entire disclosure of the application is incorporated herein by reference.

BACKGROUND OF THE INVENTION

1. Field of the Invention

The present invention relates to a substrate processing method for processing a substrate and a substrate processing apparatus for processing a substrate. Examples of substrates to be processed include semiconductor wafers, substrates for FPDs (flat panel displays) such as liquid crystal display devices, EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

In the substrate processing disclosed in US Patent Application Publication No. 2019/096721, in order to realize etching of a metal layer at an accuracy of a nanometer or less, a metal oxide layer forming step in which a metal layer of a principal surface of a substrate is oxidized by an oxidizing agent such as a hydrogen peroxide solution, etc., to form a metal oxide layer constituted of one atomic layer or several atomic layers and a metal oxide layer removing step in which the metal oxide layer is selectively removed by an etching liquid such as diluted hydrofluoric acid, etc., are repeated. A rinsing step for washing away the oxidizing agent and the etching liquid by a rinse liquid is executed between the metal oxide layer forming step and the metal oxide layer removing step.

SUMMARY OF THE INVENTION

Like the substrate processing disclosed in US Patent Application Publication No. 2019/096721, the method for etching a metal layer with a liquid in a unit of one atomic layer or several atomic layers is referred to as an ALWE (atomic layer wet etching). In the ALWE, where an etching liquid or a rinse liquid is high in oxygen concentration (dissolved oxygen concentration), an unintended metal oxide layer may be formed due to oxidation of the metal layer by oxygen in the etching liquid. Therefore, in the ALWE, in order to prevent a reduction in selective removal of the metal oxide layer, it is necessary to sufficiently decrease oxygen dissolved in the etching liquid or the rinse liquid. Further, in a case where the rinse liquid or the etching liquid does not spread over the entire principal surface of a substrate, the etching amount may become uneven at each position of the principal surface of the substrate.

Thus, an object of the present invention is to provide a substrate processing method and a substrate processing apparatus for satisfactorily controlling the etching amount of a metal layer at an accuracy of a nanometer or less at each position of a principal surface of a substrate.

A preferred embodiment of the present invention is a substrate processing method for processing a substrate which has a metal layer on a principal surface. The substrate processing method includes a metal oxide layer forming step in which an oxidizing fluid is supplied toward the principal surface of the substrate, thereby forming a metal oxide layer constituted of one atomic layer or several atomic layers on a surface layer of the metal layer and a metal oxide layer removing step in which an etching fluid containing at least one of water in a gaseous state and water in a mist state as well as a reactive gas that reacts with the metal oxide layer together with the water is supplied toward the principal surface of the substrate, thereby etching the metal oxide layer and selectively removing it from the substrate. Then, cycle processing in which the metal oxide layer forming step and the metal oxide layer removing step are given as one cycle is executed at least in one cycle, thereby controlling the etching amount of the metal layer at an accuracy of a nanometer or less.

According to the substrate processing method, in the metal oxide layer forming step, the metal oxide layer constituted of one atomic layer or several atomic layers is formed. A thickness of one atomic layer of a metal and a metal oxide is 1 nm or less (for example, 0.3 nm or more and 0.4 nm or less). Several atomic layers refer to layers from two atomic layers to ten atomic layers. Therefore, a thickness of the metal oxide layer is several nanometers (for example, 5 nm) or less.

Therefore, in the metal oxide layer removing step, the metal oxide layer is selectively removed, thus making it possible to etch a portion which is 5 nm or less in thickness from the front surface of the metal layer. Then, the cycle processing in which the metal oxide layer forming step and the metal oxide layer removing step are given as one cycle is executed at least in one cycle, and the etching amount of the metal layer can be thereby controlled for each cycle at an accuracy of a nanometer or less. The accuracy of a nanometer or less refers to an accuracy which is several nanometers (for example, 5 nm) or less.

The thickness of the metal layer which is etched by the cycle processing executed in one cycle is substantially constant. It is therefore possible to attain a desired etching amount by adjusting the number of times in which the metal oxide layer forming step and the metal oxide layer removing step are repeatedly executed.

For example, where the metal layer is etched by 0.3 nm by the cycle processing executed in one cycle, the number of times in which the cycle processing is executed can be adjusted to execute such substrate processing that etches the metal layer by 1.5 nm or execute such substrate processing that etches the metal layer by 1.8 nm. That is, it is possible to control the etching amount of the metal layer at an accuracy of approximately 0.3 nm.

Further, in this substrate processing method, in order to selectively remove the metal oxide layer, an etching fluid containing at least one of water in a gaseous state (steam) and water in a mist state as well as a reactive gas is used.

Unlike the above substrate processing method, where water in a liquid state and a reactive liquid obtained by liquefying a reactive gas are supplied in a continuous flow to a principal surface of a substrate, irregularities occur at an interface between these liquids and the principal surface of the substrate. Therefore, at the molecular level, at each position of the principal surface of the substrate, the collision frequency between the principal surface of the substrate and the molecules that constitute a reactive liquid and a reactive gas (hereinafter, referred to as "reactive molecules") or water molecules becomes uneven.

Water in a gaseous state or water in a mist state scatters more easily in the vicinity of the principal surface of the substrate than water in a liquid state which is of a continuous flow. Similarly, a reactive gas scatters more easily in the vicinity of the principal surface of the substrate than a reactive liquid. Therefore, water molecules and reactive molecules easily collide evenly at each position of the principal surface of the substrate. Accordingly, with a configuration in which an etching fluid containing at least one of water in a gaseous state and water in a mist state as well as a reactive gas is used, as compared with a configuration in which an etching liquid containing water in a liquid state and a reactive liquid is used, it is easier to suppress unevenness in the etching amount on the principal surface of the substrate at an accuracy of a nanometer or less.

As a result, it is possible to satisfactorily control the etching amount of the metal layer at an accuracy of a nanometer or less at each position of the principal surface of the substrate.

In a preferred embodiment of the present invention, the substrate processing method further includes a reactive gas eliminating step in which after the metal oxide layer removing step, at least one of water in a gaseous state and water in a mist state is continuously supplied to the principal surface of the substrate, thereby eliminating the reactive gas from a space in contact with the principal surface of the substrate.

According to this substrate processing method, instead of replacing the entire etching fluid with another gas, at least one of water in a gaseous state and water in a mist state that constitute the etching fluid is continuously supplied to eliminate the reactive gas from a space in contact with the principal surface of the substrate. Thereby, a reactive gas component which has adhered to the principal surface of the substrate can be adsorbed by water and quickly removed.

In a preferred embodiment of the present invention, the substrate processing method further includes a water eliminating step in which after the reactive gas eliminating step, water present in a space in contact with the principal surface of the substrate is replaced with an inert gas, thereby eliminating the water from the space in contact with the principal surface of the substrate.

According to this substrate processing method, the water present in the space in contact with the principal surface of the substrate is replaced with the inert gas and eliminated from this space. Therefore, it is possible to suppress unintended etching of the metal layer by a trace amount of oxygen molecules adsorbed onto water molecules.

In a preferred embodiment of the present invention, the substrate processing method further includes an oxidizing fluid eliminating step in which after the metal oxide layer forming step and also before the metal oxide layer removing step, an inert gas is supplied toward the principal surface of the substrate, by which the oxidizing fluid present in a space in contact with the principal surface of the substrate is replaced with the inert gas, thereby eliminating the oxidizing fluid from the space in contact with the principal surface of the substrate.

According to this substrate processing method, before the metal oxide layer removing step, the oxidizing fluid is eliminated from the space in contact with the principal surface of the substrate. Therefore, it is possible to suppress unintended oxidation of the metal layer in the metal oxide layer removing step.

In a preferred embodiment of the present invention, the metal oxide removing step includes an etching fluid supplying step in which an etching fluid is supplied from an etching fluid supplying unit toward the principal surface of the substrate and a temperature adjusting step in which a temperature of the substrate is adjusted to a temperature lower than that of the etching fluid supplied from the etching fluid supplying unit.

Therefore, since the temperature of the etching fluid is lowered in the vicinity of the principal surface of the substrate, reactive molecules and water molecules are decreased in kinetic energy in the vicinity of the principal surface of the substrate. Therefore, the reactive molecules and the water molecules adsorbed onto the principal surface of the substrate are prevented from separating from the principal surface of the substrate. In other words, adsorption of the reactive molecules and the water molecules onto the principal surface of the substrate is accelerated. Thereby, the metal layer can be increased in etching speed. As a result, the metal layer can be increased in etching speed, while the etching amount for one cycle of the cycle processing is kept to one atomic layer or several atomic layers.

In a preferred embodiment of the present invention, the metal oxide layer forming step includes a heating oxidation step in which while the substrate is heated, the oxidizing fluid is supplied toward the principal surface of the substrate, thereby forming a metal oxide layer. The metal oxide layer removing step includes a low temperature etching step in which in a state where a temperature of the substrate is lower than a temperature of the substrate in the metal oxide layer forming step, the etching fluid is supplied toward the principal surface of the substrate, thereby etching the metal oxide layer.

According to this substrate processing method, the metal layer on the principal surface of the substrate is oxidized when the substrate is relatively high in temperature (for example, 100° C. or higher and 400° C. or lower). Therefore, the metal layer can be increased in oxidation speed. On the other hand, etching is executed when the substrate is relatively low in temperature (for example, 25° C. or higher and 100° C. or lower). As long as the substrate is relatively high in temperature, just a slight amount of oxygen molecules present in the etching fluid will have oxidizing power. Therefore, etching is executed at a relatively low temperature, thus making it possible to suppress unintended oxidation of the metal layer in the metal oxide layer removing step.

In a preferred embodiment of the present invention, in the heating oxidation step, while the oxidizing fluid is supplied toward the principal surface of the substrate, the substrate is placed on a heating surface of a heating member disposed inside a chamber, thereby heating the substrate. In the low temperature etching step, while a state where the substrate is placed on the heating surface is kept, the heating member is lowered in temperature, thereby lowering the temperature of the substrate.

According to this substrate processing method, in a state where the substrate is placed on the heating surface of the single heating member, the substrate is heated and is also lowered in temperature. Therefore, the substrate processing can be made simple, as compared with a configuration in which the substrate is moved to a member different from the heating member for changing the temperature of the substrate.

In a preferred embodiment of the present invention, in the heating oxidation step, while the oxidizing fluid is supplied toward the principal surface of the substrate, the substrate is placed on a temperature adjusting surface of a first temperature adjusting member disposed inside a first chamber, thereby heating the substrate. Then, in the low temperature etching step, the substrate is moved from the temperature adjusting surface and the substrate is placed on a second temperature adjusting surface of a second temperature adjusting member which is disposed inside a second chamber and is lower in temperature than the first temperature adjusting member, thereby lowering the temperature of the substrate.

According to this substrate processing method, the temperature of the substrate is adjusted on the first temperature adjusting surface of the first temperature adjusting member and, thereafter, adjusted on the second temperature adjusting surface of the second temperature adjusting member. That is, the temperature is adjusted twice by different members. Therefore, the time necessary for adjusting the temperature of the substrate can be shortened, as compared with a configuration in which the temperature of the substrate is adjusted by changing the temperature of the temperature adjusting surface of the single temperature adjusting member.

In a preferred embodiment of the present invention, the metal layer includes a metal nitride layer containing a Group III metal. The Group III metal means a metal which belongs to Group 13 of the Periodic Table of Elements. Specifically, the Group III metals are aluminum (Al), gallium (Ga), indium (In) and thallium (Tl). A metal nitride containing a Group III metal forms an oxide which reacts with water and a reactive gas by oxidation.

For example, when the metal nitride layer is a gallium nitride layer (GaN) and the oxidizing fluid is an ozone gas, as shown in Chemical Reaction Formula 1 given below, gallium nitride is oxidized by ozone molecules ($O_3$) to produce gallium oxide ($Ga_2O_3$). Specifically, ozone molecules are heated to produce oxygen radicals and gallium nitride is oxidized by the oxygen radicals.

$2GaN + O_3 \rightarrow Ga_2O_3 + N_2$      [Chemical Reaction Formula 1]

Where the reactive gas contained in an etching fluid is an ammonia gas ($NH_3$), reactions shown in Chemical Reaction Formula 2 and 3 given below occur. As shown in Chemical Reaction Formula 2, gallium oxide reacts with hydroxide ions and gallium oxide is dissolved in the etching fluid to give an ionic state. Also, as shown in Chemical Reaction Formula 3, gallium oxide reacts with water and ammonia, and gallium oxide is dissolved in the etching fluid to give an ionic state.

$Ga_2O_3 + 6OH^- \rightarrow 2GaO_3^{3-} + 3H_2O$      [Chemical Reaction Formula 2]

$Ga_2O_3 + 6NH_3 + 6H_2O \rightarrow 2GaO_3^{3-} + 6NH_4^+ + 3H_2O$      [Chemical Reaction Formula 3]

Where the reactive gas contained in an etching fluid is a hydrogen chloride gas (HCl), reactions shown in Chemical Reaction Formulae 4 and 5 given below occur. As shown in Chemical Reaction Formula 4, gallium oxide reacts with hydrogen chloride, and gallium oxide is dissolved in the etching fluid to give an ionic state. Also, as shown in Chemical Reaction Formula 5, gallium oxide reacts with hydrogen chloride, and gallium oxide is dissolved in the etching fluid to give an ionic state.

$Ga_2O_3 + 6HCl \rightarrow 2GaCl_3 + 3H_2O$      [Chemical Reaction Formula 4]

$Ga_2O_3 + 6HCl \rightarrow 2Ga^{3-} + 6Cl^- + 3H_2O$      [Chemical Reaction Formula 5]

In a preferred embodiment of the present invention, the water contained in the etching fluid is water in a gaseous state. In the metal oxide layer removing step, where water in a gaseous state is used, water in a bulk state (in a state of very small-sized droplets) is less likely to adhere to the principal surface of the substrate, as compared with a case where water in a mist state is used. Accordingly, with a configuration in which water in a gaseous state is used as the water contained in the etching fluid, it is possible to make water molecules collide more evenly with each position of the principal surface of the substrate.

Another preferred embodiment of the present invention provides a substrate processing apparatus for processing a substrate which has a metal layer on a principal surface. The substrate processing apparatus includes a temperature adjusting member which has a temperature adjusting surface on which the substrate is placed and adjusts a temperature of the substrate placed on the temperature adjusting surface to a predetermined first temperature and a second temperature which is lower than the first temperature, a chamber which houses the temperature adjusting member, an oxidizing fluid supplying unit which supplies an oxidizing fluid into the chamber, thereby forming a metal oxide layer constituted of one atomic layer or several atomic layers on a surface layer of the metal layer, and an etching fluid supplying unit which supplies an etching fluid containing at least one of water in a gaseous state and water in a mist state as well as a reactive gas that reacts with the metal oxide layer together with the water into the chamber, thereby selectively etching the metal oxide layer.

According to this substrate processing apparatus, the metal oxide layer constituted of one atomic layer or several atomic layers is formed by the oxidizing fluid supplied from the oxidizing fluid supplying unit. Therefore, the metal oxide layer is selectively removed by the etching fluid supplied from the etching fluid supplying unit, thus making it possible to etch a portion having a thickness of 5 nm or less from a front surface of the metal layer. Formation of the metal oxide layer by the oxidizing fluid supplying unit and selective removal of the metal oxide layer by the etching fluid supplying unit are repeated, by which the etching amount of the metal layer can be controlled at an accuracy of a nanometer or less.

The thickness of the metal layer which is etched by formation of the metal oxide layer by the oxidizing fluid supplying unit and selective removal of the metal oxide layer by the etching fluid supplying unit, which are executed once respectively, is substantially constant. It is therefore possible to attain a desired etching amount by adjusting the number of times in which formation of the metal oxide layer and removal of the metal oxide layer are repeatedly executed.

Further, in this substrate processing apparatus, the etching fluid containing at least one of water in a gaseous state (steam) and water in a mist state as well as a reactive gas is used for selectively removing the metal oxide layer. Therefore, as described above, water molecules and reactive molecules easily collide evenly at each position of the principal surface of the substrate. Accordingly, with a configuration in which an etching fluid containing at least one of water in a gaseous state and water in a mist state as well as a reactive gas is used, as compared with a configuration in which an etching liquid containing water in a liquid state and a reactive liquid is used, it is possible to suppress unevenness in the etching amount on the principal surface of the substrate at an accuracy of a nanometer or less.

As a result, it is possible to satisfactorily control the etching amount of the metal layer at each position of the principal surface of the substrate at an accuracy of a nanometer or less.

In another preferred embodiment of the present invention, the substrate processing apparatus includes a controller which controls the oxidizing fluid supplying unit and the etching fluid supplying unit. The controller is programmed so as to execute a metal oxide layer forming step in which the oxidizing fluid is supplied from the oxidizing fluid supplying unit toward the principal surface of the substrate, thereby forming the metal oxide layer constituted of one atomic layer or several atomic layers on the surface layer of the metal layer, and a metal oxide layer removing step in which an etching fluid is supplied from the etching fluid supplying unit toward the principal surface of the substrate, thereby etching the metal oxide layer and selectively removing it from the principal surface of the substrate. Then, cycle processing in which the metal oxide layer forming step and the metal oxide layer removing step are given as one cycle is executed at least in one cycle, thereby controlling the etching amount of the metal layer for each cycle at an accuracy of a nanometer or less.

According to this substrate processing apparatus, the cycle processing in which the metal oxide layer forming step and the metal oxide layer removing step are given as one cycle can be executed automatically for any desired number of cycle times. The thickness of the metal layer which is etched by execution of the cycle processing in one cycle is substantially constant. Therefore, it is possible to attain a desired etching amount by adjusting the number of times in which the metal oxide layer forming step and the metal oxide layer removing step are executed.

In another preferred embodiment of the present invention, the etching fluid supplying unit is configured so as to supply an etching fluid into the chamber via a fluid introducing port which is opened inside the chamber. Then, the second temperature is lower than a temperature of the etching fluid introduced into the chamber via the fluid introducing port.

Therefore, since the temperature of the etching fluid is lowered in the vicinity of the principal surface of the substrate, reactive molecules and water molecules are decreased in kinetic energy in the vicinity of the principal surface of the substrate. Therefore, the reactive molecules and the water molecules adsorbed onto the principal surface of the substrate are prevented from separating from the principal surface of the substrate. In other words, adsorption of the reactive molecules and the water molecules onto the principal surface of the substrate is accelerated. Thereby, the metal layer can be increased in etching speed. As a result, the metal layer can be increased in etching speed, while the etching amount for one cycle of the cycle processing is kept to one atomic layer or several atomic layers.

In another preferred embodiment of the present invention, the temperature adjusting member is configured so as to have the single temperature adjusting surface and, in a state where the substrate is placed on the single temperature adjusting surface, adjust the temperature of the substrate to the first temperature and the second temperature.

According to this substrate processing apparatus, in a state where the substrate is placed on the single temperature adjusting surface, the substrate is heated and is also lowered in temperature. Therefore, the substrate processing can be made simple, as compared with a configuration in which the substrate is moved to a member different from the heating member for changing the temperature of the substrate.

In another preferred embodiment of the present invention, the temperature adjusting member has a first temperature adjusting member which has a first temperature adjusting surface as the temperature adjusting surface and adjusts the substrate placed on the first temperature adjusting surface to the first temperature and a second temperature adjusting member which has a second temperature adjusting surface as the temperature adjusting surface and adjusts the substrate placed on the second temperature adjusting surface to the second temperature. The chamber has a first chamber which houses the first temperature adjusting member and a second chamber which houses the second temperature adjusting member. Then, the oxidizing fluid supplying unit is configured so as to supply an oxidizing fluid into the first chamber, and the etching fluid supplying unit is configured so as to supply an etching fluid into the second chamber.

According to this substrate processing apparatus, the temperature of the substrate is adjusted on the first temperature adjusting surface of the first temperature adjusting member and, thereafter, adjusted on the second temperature adjusting surface of the second temperature adjusting member. That is, the temperature is adjusted twice by different members. Therefore, the time necessary for adjusting the temperature of the substrate can be shortened, as compared with a configuration in which the temperature of the substrate is adjusted by changing the temperature of the temperature adjusting surface of the single temperature adjusting member.

In another preferred embodiment of the present invention, the first temperature is 100° C. or higher and 400° C. or lower and the second temperature is 25° C. or higher and 100° C. or lower. That is, the metal layer of the principal surface of the substrate is oxidized when the substrate is relatively high in temperature (for example, 100° C. or higher and 400° C. or lower). Therefore, the metal layer can be increased in oxidation speed. On the other hand, etching is executed when the substrate is relatively low in temperature (for example, 25° C. or higher and 100° C. or lower). As long as the substrate is relatively high in temperature, just a slight amount of oxygen molecules present in the etching fluid will have oxidizing power. Therefore, etching is executed at a relatively low temperature, thus making it possible to suppress unintended oxidation of the metal layer.

The aforementioned as well as yet other objects, features, and effects of the present invention will be made clear by the following description of preferred embodiments, with reference to the accompanying drawings.

BRIEF DESCRIPTION OF THE DRAWINGS

FIG. 12 is a flow chart for describing a flow of specific substrate processing by the substrate processing apparatus according to the second preferred embodiment.

DETAILED DESCRIPTION OF THE PREFERRED EMBODIMENTS

First Preferred Embodiment

Figure 1A:
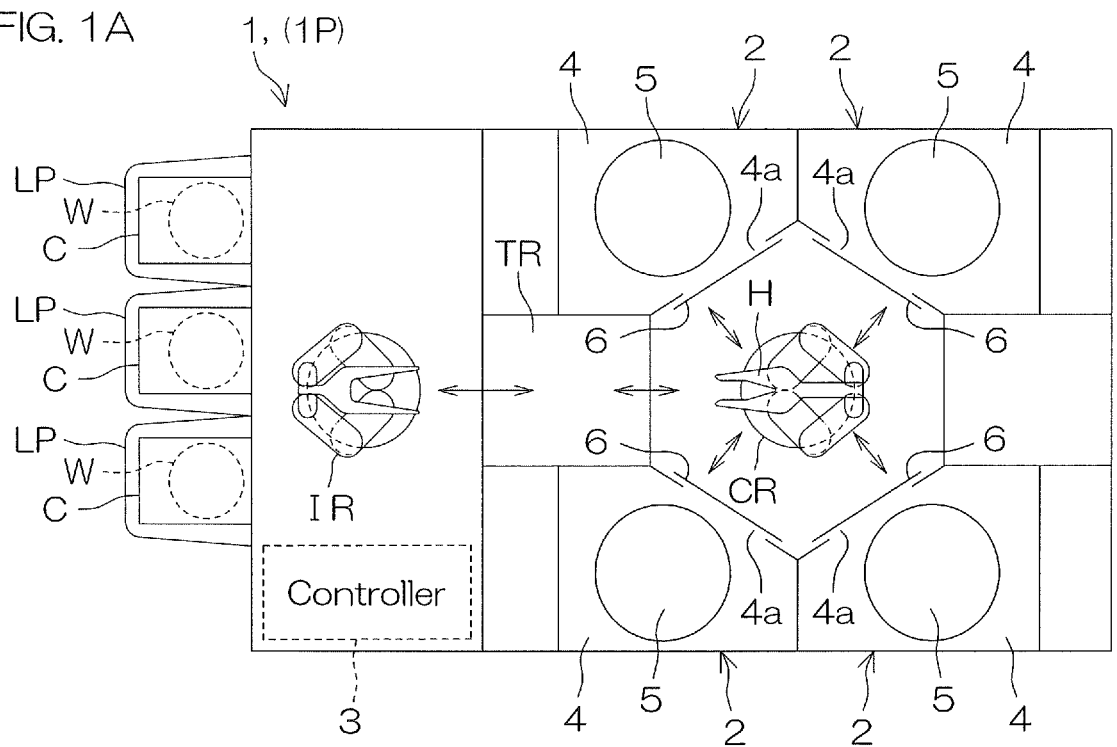
FIG. 1A is a plan view for describing a configuration of a substrate processing apparatus according to a first preferred embodiment of the present invention.
Figure 1B:
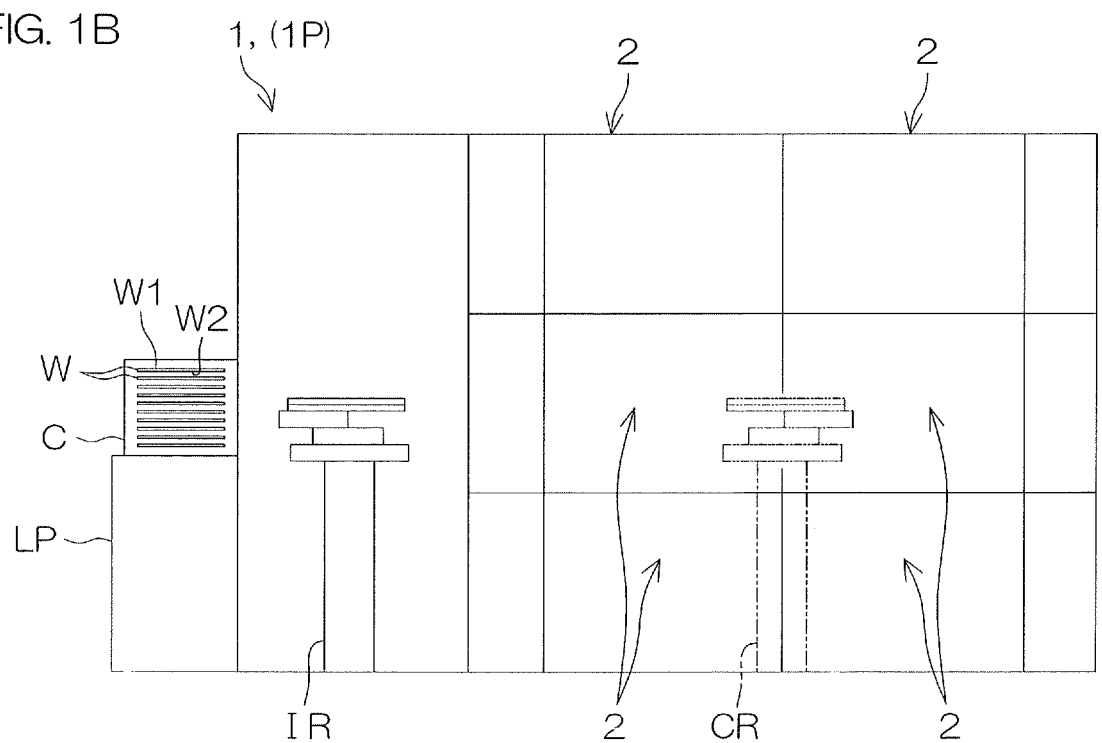
FIG. 1B is an illustrative elevation view for describing a configuration of the substrate processing apparatus.

FIG. 1A is a plan view for describing a configuration of a substrate processing apparatus 1 according to the first preferred embodiment of the present invention. FIG. 1B is an illustrative elevation view for describing a configuration of the substrate processing apparatus 1.

The substrate processing apparatus 1 is a single substrate processing type apparatus which processes a substrate W such as a silicon wafer one at a time. In this preferred embodiment, the substrate W is a disk-shaped substrate. The substrate W has, for example, a first principal surface W1 from which a metal layer is exposed (refer to FIG. 1B) and a second principal surface W2 at the opposite side of the first principal surface W1.

The metal layer exposed from the first principal surface W1 is a metal nitride layer containing, for example, a Group III metal. The Group III metal means a metal which belongs to Group 13 of the Periodic Table of Elements. Specifically, the Group III metals are aluminum (Al), gallium (Ga), indium (In) and thallium (Tl).

The substrate processing apparatus 1 includes a plurality of processing units 2 which process the substrate W by a processing fluid, a load port LP on which a carrier C that houses a plurality of the substrates W to be processed by the processing units 2 is placed, transfer robots IR and CR which transfer the substrate W between the load port LP and the processing units 2, and a controller 3 which controls the substrate processing apparatus 1.

The transfer robot IR transfers the substrate W between the carrier C and the transfer robot CR. The transfer robot CR transfers the substrate W between the transfer robot IR and the processing units 2. The transfer robots IR, CR are disposed on a transfer route TR extending from a plurality of the load ports LP to the plurality of processing units 2.

The plurality of processing units 2 form four processing towers which are disposed respectively at four positions which are separated horizontally. Each of the processing towers includes the plurality of processing units 2 which are stacked in an up/down direction. The two of four processing towers are disposed each at both sides of the transfer route TR. In this preferred embodiment, the processing unit 2 is a dry processing unit which processes the substrate W by a processing gas such as an oxidizing gas and an etching gas without supplying a liquid to the substrate W.

The processing unit 2 includes a dry chamber 4 which is provided with a carrying-in/carrying-out port 4a through which the substrate W passes and a heat processing unit 5 which supplies a processing gas to the substrate W while heating the substrate W inside the dry chamber 4. The carrying-in/carrying-out port 4a is provided with a shutter 6 which can be opened and closed. A hand H of the transfer robot CR carries the substrate W into and carries it out from the dry chamber 4 via the carrying-in/carrying-out port 4a.

Figure 2:
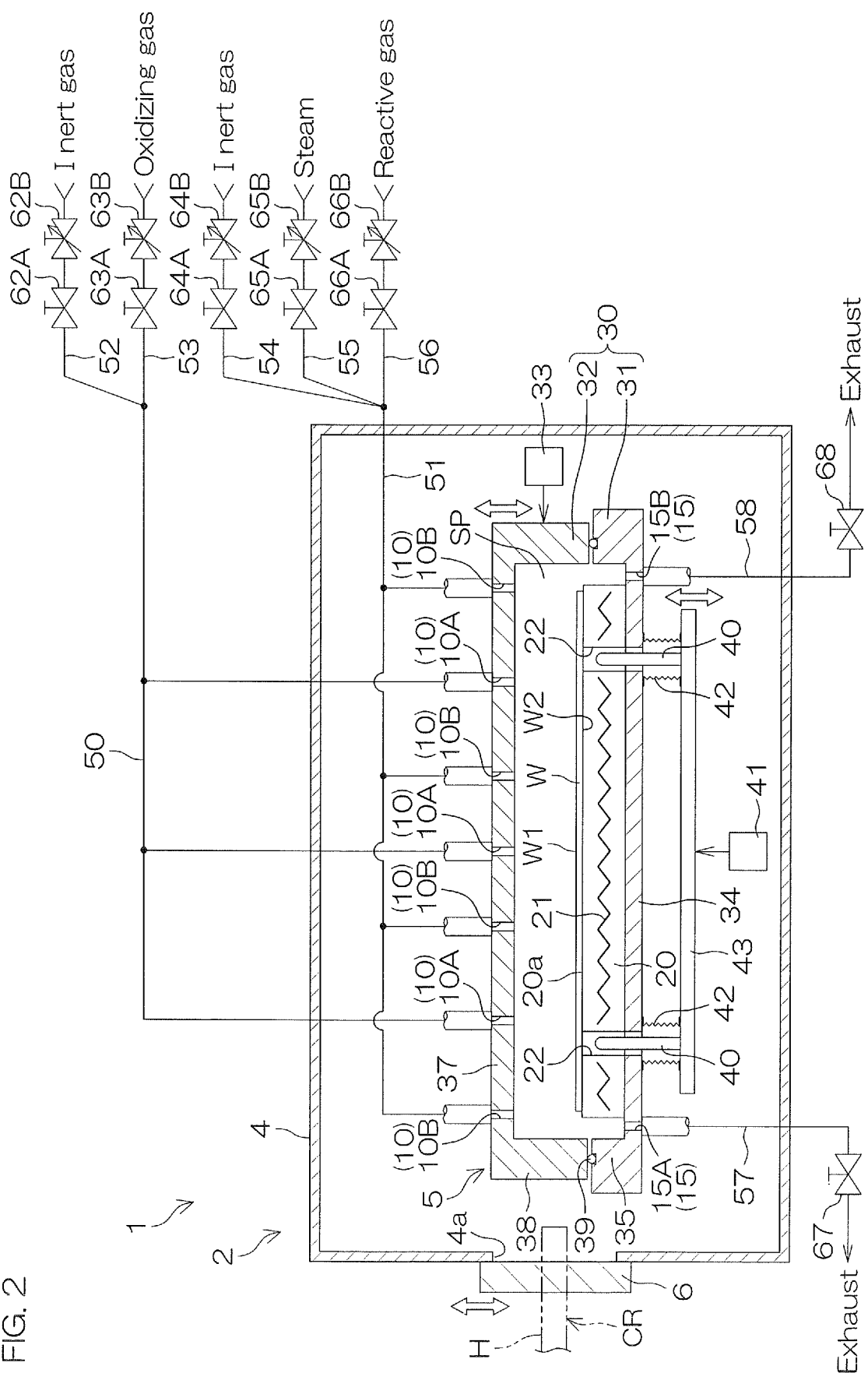
FIG. 2 is a schematic cross-sectional view for describing a configuration example of a heat processing unit provided in the substrate processing apparatus.

FIG. 2 is a schematic cross-sectional view for describing a configuration example of the heat processing unit 5.

The heat processing unit 5 is provided with a hot plate 20 as a heating member, a heat processing chamber 30 (chamber) which houses the hot plate 20, a plurality of lift pins 40 which penetrate through the hot plate 20 and move up and down and a pin raising/lowering driving mechanism 41 which moves the plurality of lift pins 40 in an up/down direction.

The hot plate 20 has a heating surface 20a on which the substrate W is placed. A heater 21 is incorporated in the hot plate 20. The heater 21 can heat the substrate W at a temperature substantially equal to a temperature of the heater 21. The heater 21 is configured so as to heat the substrate W placed on the heating surface 20a in a temperature range of an ordinary temperature (for example, 25° C.) or higher and 400° C. or lower. Specifically, an energizing unit (not shown) is connected to the heater 21 and a current supplied from the energizing unit is adjusted to change the temperature of the heater 21 to a temperature within the temperature range. The hot plate 20 is an example of a temperature adjusting member, and the heating surface 20a is an example of a temperature adjusting surface.

The heat processing chamber 30 is provided with a chamber main body 31 and a lid 32 which moves up and down above the chamber main body 31. The heat processing unit 5 is provided with a lid raising/lowering driving mechanism 33 which raises and lowers (moves in an up/down direction) the lid 32.

The chamber main body 31 has an opening which is opened upward. Specifically, the chamber main body 31 includes a supporting portion 34 which supports the hot plate 20 and a tubular portion 35 which extends upward from a peripheral edge of the supporting portion 34. The supporting portion 34 has a substantially circular shape in a plan view and accordingly the tubular portion 35 has a cylindrical shape. The opening of the chamber main body 31 is formed by the tubular portion 35.

The lid 32 includes a plate portion 37 which extends in parallel to the heating surface 20a and a tubular portion 38 which extends downward from a peripheral edge of the plate portion 37. The plate portion 37 is substantially in a circular shape in a plan view and, accordingly, the tubular portion 38 has a cylindrical shape. A lower end of the tubular portion 38 faces an upper end of the tubular portion 35 of the chamber main body 31. Thereby, the opening of the chamber main body 31 can be opened and closed by up/down movement of the lid 32. A space between the tubular portion 35 of the chamber main body 31 and the tubular portion 38 of the lid 32 is sealed by an elastic member 39 such as an O-ring, etc. A lower surface of the plate portion 37 is parallel to the heating surface 20a of the hot plate 20. More specifically, a space is formed between the substrate W and the plate portion 37 when the substrate W is placed on the heating surface 20a.

The lid 32 is, by the lid raising/lowering driving mechanism 33, moved up and down between a lower position (position shown in FIG. 2) in which the opening of the chamber main body 31 is closed to form internally a sealed processing space SP and an upper position (position shown in FIG. 3 as described later) in which the lid 32 has retreated above so as to open the opening. When the lid 32 is positioned at the lower position, the chamber main body 31 is in contact with the lid 32. The sealed processing space SP is a space which is in contact with an upper surface of the substrate W. When the lid 32 is positioned at the upper position, the hand H of the transfer robot CR can gain access to the inside of the heat processing chamber 30.

The lid raising/lowering driving mechanism 33 may be an electric motor or an air cylinder or may be an actuator other than them.

The plurality of lift pins 40 are coupled by a coupling plate 43. The plurality of lift pins 40 are, due to raising and lowering of the coupling plate 43 by the pin raising/lowering driving mechanism 41, moved up and down between the upper position (position shown in FIG. 3 as described later) in which the substrate W is supported higher than the heating surface 20*a* and the lower position (position shown in FIG. 2) in which tip portions (upper end portions) thereof sink down lower than the heating surface 20*a*. The pin raising/lowering driving mechanism 41 may be an electric motor or an air cylinder and may be an actuator other than them.

The plurality of lift pins 40 are respectively inserted into a plurality of through holes 22 which penetrate through the hot plate 20 and the chamber main body 31. A bellows 42 which surrounds the lift pin 40 prevents a fluid from entering into the through hole 22 from outside the heat processing chamber 30. The bellows 42 expands and contracts depending on up/down movement of the coupling plate 43 and also maintains airtightness of a space inside the heat processing chamber 30.

The lift pin 40 includes a hemispherical upper end portion in contact with a lower surface of the substrate W. The leading end portions of the plurality of lift pins 40 are disposed at the same height.

The heat processing unit 5 is provided with a plurality of fluid introducing ports 10 which introduce a gas into the sealed processing space SP inside the heat processing chamber 30. Each of the fluid introducing ports 10 is a through hole which penetrates through the plate portion 37 of the lid 32. The plurality of fluid introducing ports 10 are disposed at intervals in a peripheral direction and a radial direction of the plate portion 37.

The plurality of fluid introducing ports 10 include a plurality of first fluid introducing ports 10A to which a first fluid line 50 for guiding an inert gas and an oxidizing gas is connected and a plurality of second fluid introducing ports 10B to which a second fluid line 51 for guiding an inert gas and an etching gas is connected. The first fluid line 50 and the second fluid line 51 are mainly constituted of piping.

The inert gas is, for example, a nitrogen ($N_2$) gas. The inert gas is a gas which will not react with a metal nitride layer (inactive with a metal nitride layer) exposed from the first principal surface W1 of the substrate W.

The inert gas is not limited to a nitrogen gas and may be, for example, a rare gas such as argon (Ar) gas, etc. It may be a mixed gas of a nitrogen gas and a rare gas. That is, the inert gas may be a gas containing at least one of a nitrogen gas and a rare gas.

The oxidizing gas is, for example, an ozone ($O_3$) gas. The oxidizing gas is a gas which oxidizes a metal nitride layer exposed from the first principal surface W1 of the substrate W to form a metal oxide layer. The oxidizing gas is not limited to an ozone gas and may be, for example, oxidizing steam, $O_2$, $N_2O$, $NO_2$, or a halogen gas such as $F_2$, $Cl_2$, etc. Where the metal nitride layer is a gallium nitride layer, the metal nitride layer is oxidized by an oxidizing gas and changed to a gallium oxide layer. The oxidizing gas is also referred to as a gaseous oxidizing agent.

The etching gas is a gas which etches a metal oxide layer to remove the metal oxide layer from the first principal surface W1 of the substrate W. The etching gas is a mixed gas of steam and a reactive gas. The reactive gas is a gas which is reactive with the metal oxide layer in the presence of water and, for example, an ammonia ($NH_3$) gas. Overheated steam which is sufficiently heated, that is, heated at 100° C. or higher is preferably used as steam. The etching gas is an example of the etching fluid.

A metal oxide which constitutes the metal oxide layer reacts with the reactive gas and steam to produce a metal hydroxide which is adsorbed by steam. The metal hydroxide is adsorbed by steam in the etching gas and the metal hydroxide is removed from the upper surface of the substrate W.

The reactive gas is not limited to an ammonia gas but may be an alkaline gas containing an alkaline component showing alkalinity in water or may be an acidic gas containing an acidic component showing acidity in water. For example, an ammonia gas is selected as the alkaline gas.

The acidic gas is typically a hydrogen chloride (HCl) gas. The acidic gas may be constituted of at least one type of gas selected among hydrogen chloride gas, carbon dioxide gas, hydrogen sulfide ($H_2S$) gas and sulfur dioxide ($SO_2$) gas.

The Group III metal is used as a material of a power device, as with silicon (Si). Unlike a silicon carbide (SiC) crystal, an oxide of the Group III metal which is formed on a front surface of a nitride crystal of the Group III metal reacts with an alkaline component or an acidic component in the presence of water to form a water-soluble hydroxide.

Where the metal nitride layer is a gallium nitride layer, as shown in Chemical Reaction Formula 1 given above, gallium nitride which constitutes the gallium nitride layer reacts with an ozone gas as an oxidizing gas to produce gallium oxide ($Ga_2O_3$) which constitutes the gallium oxide layer as a metal oxide layer. Where the reactive gas is an ammonia gas, gallium oxide which constitutes the gallium oxide layer reacts with an ammonia gas and, as shown in Chemical Reaction Formulae 2 and 3 given above, gallium oxide reacts with ammonia or reacts with ammonia and water. Where the reactive gas contained in the etching fluid is a hydrogen chloride gas, as shown in Chemical Reaction Formulae 4 and 5 given above, gallium oxide reacts with hydrogen chloride.

A first inert gas line 52 which supplies an inert gas to the first fluid line 50 and an oxidizing fluid line 53 which supplies an oxidizing gas to the first fluid line 50 are connected to the first fluid line 50.

A first inert gas valve 62A which opens/closes a flow channel of the first inert gas line 52 and a first inert gas flow rate adjusting valve 62B which adjusts a flow rate of the inert gas supplied to the first fluid line 50 are interposed in the first inert gas line 52.

An oxidizing fluid valve 63A which opens/closes a flow channel of the oxidizing fluid line 53 and an oxidizing fluid flow rate adjusting valve 63B which adjusts a flow rate of the oxidizing gas supplied to the first fluid line 50 are interposed in the oxidizing fluid line 53.

When the first inert gas valve 62A is opened, an inert gas is introduced into the sealed processing space SP from the plurality of first fluid introducing ports 10A and the inert gas is supplied toward the upper surface of the substrate W. When the oxidizing fluid valve 63A is opened, an oxidizing gas is introduced into the sealed processing space SP from the plurality of first fluid introducing ports 10A and the oxidizing gas is supplied toward the upper surface of the substrate W.

When both the first inert gas valve 62A and the oxidizing fluid valve 63A are opened, a mixed gas of the inert gas and the oxidizing gas is introduced into the sealed processing space SP from the plurality of first fluid introducing ports 10A. The opening degree of the first inert gas flow rate adjusting valve 62B and the oxidizing fluid flow rate adjusting valve 63B are adjusted, thus making it possible to adjust a concentration (partial pressure) of an oxidizing gas component in the mixed gas introduced from the plurality of first fluid introducing ports 10A into the sealed processing space SP.

The first fluid line 50, the first inert gas line 52 and the first inert gas valve 62A are examples of an inert gas supplying unit. The first fluid line 50, the oxidizing fluid line 53 and the oxidizing fluid valve 63A are examples of an oxidizing fluid supplying unit which supplies an oxidizing fluid into the heat processing chamber 30.

A second inert gas line 54 which supplies an inert gas to the second fluid line 51, a water line 55 which supplies steam to the second fluid line 51 and a reactive gas line 56 which supplies a reactive gas to the second fluid line 51 are connected to the second fluid line 51.

A second inert gas valve 64A which opens/closes a flow channel of the second inert gas line 54 and a second inert gas flow rate adjusting valve 64B which adjusts a flow rate of an inert gas supplied to the second fluid line 51 are interposed in the second inert gas line 54.

A water valve 65A which opens/closes a flow channel of the water line 55 and a water flow rate adjusting valve 65B which adjusts a flow rate of steam supplied to the second fluid line 51 are interposed in the water line 55.

A reactive gas valve 66A which opens/closes a flow channel of the reactive gas line 56 and a reactive gas flow rate adjusting valve 66B which adjusts a flow rate of the reactive gas supplied to the second fluid line 51 are interposed in the reactive gas line 56.

When the second inert gas valve 64A is opened, an inert gas is introduced into the sealed processing space SP from the plurality of second fluid introducing ports 10B and the inert gas is supplied toward the upper surface of the substrate W. When the water valve 65A is opened, steam is introduced from the plurality of second fluid introducing ports 10B into the sealed processing space SP and the steam is supplied toward the upper surface of the substrate W. When the reactive gas valve 66A is opened, a reactive gas is introduced from the plurality of second fluid introducing ports 10B into the sealed processing space SP and the reactive gas is supplied toward the upper surface of the substrate W.

When at least two of the second inert gas valve 64A, the water valve 65A and the reactive gas valve 66A are opened, a mixed gas of the gases corresponding to the valves which are opened among an inert gas, steam and a reactive gas is introduced (supplied) from the plurality of second fluid introducing ports 10B into the sealed processing space SP. When both the water valve 65A and the reactive gas valve 66A are opened, steam and a reactive gas are mixed together inside the second fluid line 51 to produce an etching gas, and the etching gas is introduced from the plurality of second fluid introducing ports 10B into the sealed processing space SP.

The opening degree of the second inert gas flow rate adjusting valve 64B, the water flow rate adjusting valve 65B and the reactive gas flow rate adjusting valve 66B are adjusted, thus making it possible to adjust concentrations (partial pressures) of a reactive gas component and steam in a gas introduced from the plurality of second fluid introducing ports 10B into the sealed processing space SP.

The second fluid line 51, the second inert gas line 54 and the second inert gas valve 64A are examples of the inert gas supplying unit. The second fluid line 51, the water line 55 and the water valve 65A are examples of a water supplying unit (steam supplying unit). The second fluid line 51, the reactive gas line 56 and the reactive gas valve 66A are examples of a reactive gas supplying unit. The water supplying unit and the reactive gas supplying unit function as an etching gas supplying unit (etching fluid supplying unit) which supplies an etching gas into the heat processing chamber 30.

The heat processing unit 5 is provided with a plurality of fluid discharge ports 15 which are formed in the chamber main body 31 to exhaust an inner atmosphere of the heat processing chamber 30. Each of the fluid discharge ports 15 is a through hole which penetrates through the supporting portion 34 of the chamber main body 31 at the side of the hot plate 20. The plurality of fluid discharge ports 15 are preferably disposed at intervals in a peripheral direction of the supporting portion 34.

The plurality of fluid discharge ports 15 include a plurality of first fluid discharge ports 15A to which a first fluid discharge line 57 that exhausts mainly an oxidizing gas is connected and a plurality of second fluid discharge ports 15B to which a second fluid discharge line 58 that exhausts mainly an etching gas is connected. The first fluid discharge line 57 and the second fluid discharge line 58 are mainly constituted of piping.

A first fluid discharge valve 67 which opens/closes a flow channel of the first fluid discharge line 57 is interposed in the first fluid discharge line 57, and a second fluid discharge valve 68 which opens/closes a flow channel of the second fluid discharge line 58 is interposed in the second fluid discharge line 58. The first fluid discharge line 57 and the second fluid discharge line 58 may be configured so as to discharge a fluid toward a common exhaust device (not shown) or may be different from each other in an exhaust destination.

Figure 3:
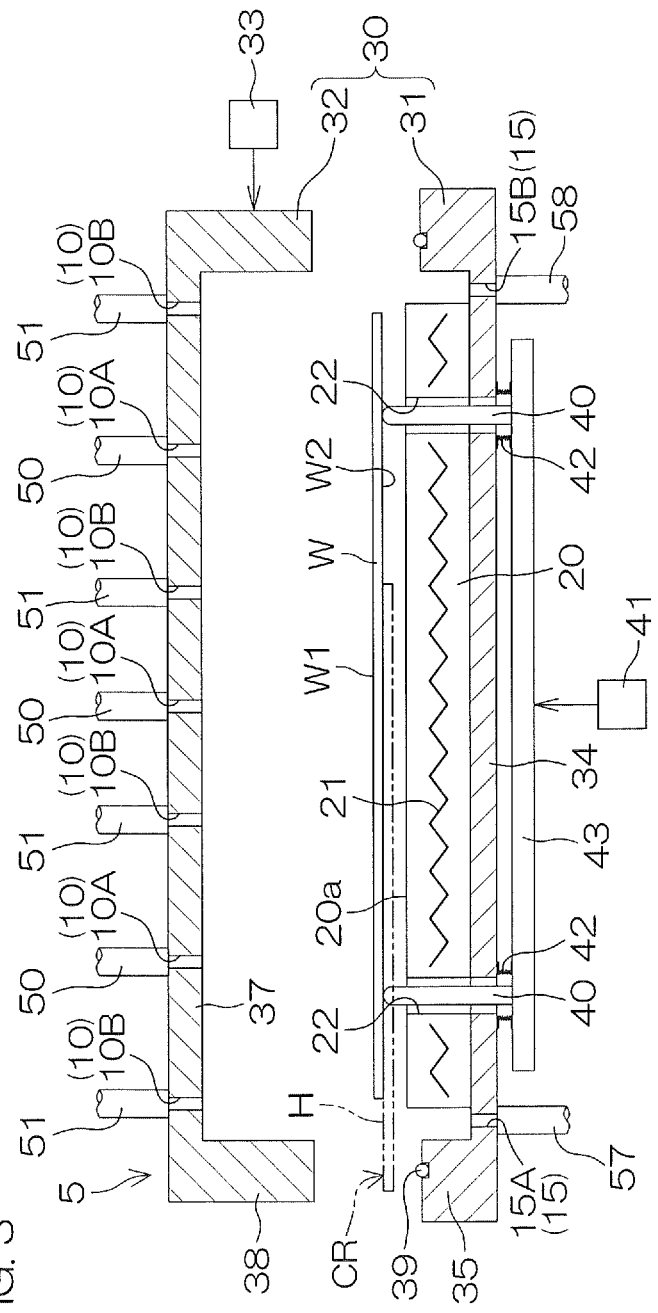
FIG. 3 is a schematic view for describing conditions in which a substrate is carried into and carried out from the heat processing unit provided in the substrate processing apparatus.

FIG. 3 is a schematic view for describing conditions in which the substrate W is carried into and carried out from the heat processing unit 5.

The substrate W is carried into the heat processing unit 5 in the following manner. As shown in FIG. 3, in a state where the lid 32 is positioned at the upper position and the plurality of lift pins 40 are positioned at the upper position, the hand H of the transfer robot CR enters into the heat processing chamber 30 and delivers the substrate W to the plurality of lift pins 40. After the hand H has retreated from the heat processing chamber 30, the pin raising/lowering driving mechanism 41 lowers the plurality of lift pins 40 which support the substrate W from below to place the substrate W on the heating surface 20a of the hot plate 20 (refer to FIG. 2). In a state where the substrate W is placed on the heating surface 20a, the lid 32 is moved to the lower position to form the sealed processing space SP, thereby completing carrying-in of the substrate W.

On the other hand, the substrate W is carried out from the heat processing unit 5 in the following manner. As shown in FIG. 3, the lid raising/lowering driving mechanism 33 moves the lid 32 to the upper position and the pin raising/lowering driving mechanism 41 moves the plurality of lift pins 40 to the upper position. In a state where the lid 32 is positioned at the upper position and the plurality of lift pins 40 are positioned at the upper position, the hand H of the transfer robot CR enters into the heat processing chamber 30 and receives the substrate W from the plurality of lift pins 40. Thereafter, the hand H of the transfer robot CR retreats from the heat processing chamber 30, thereby completing carrying-out of the substrate W.

Figure 4:
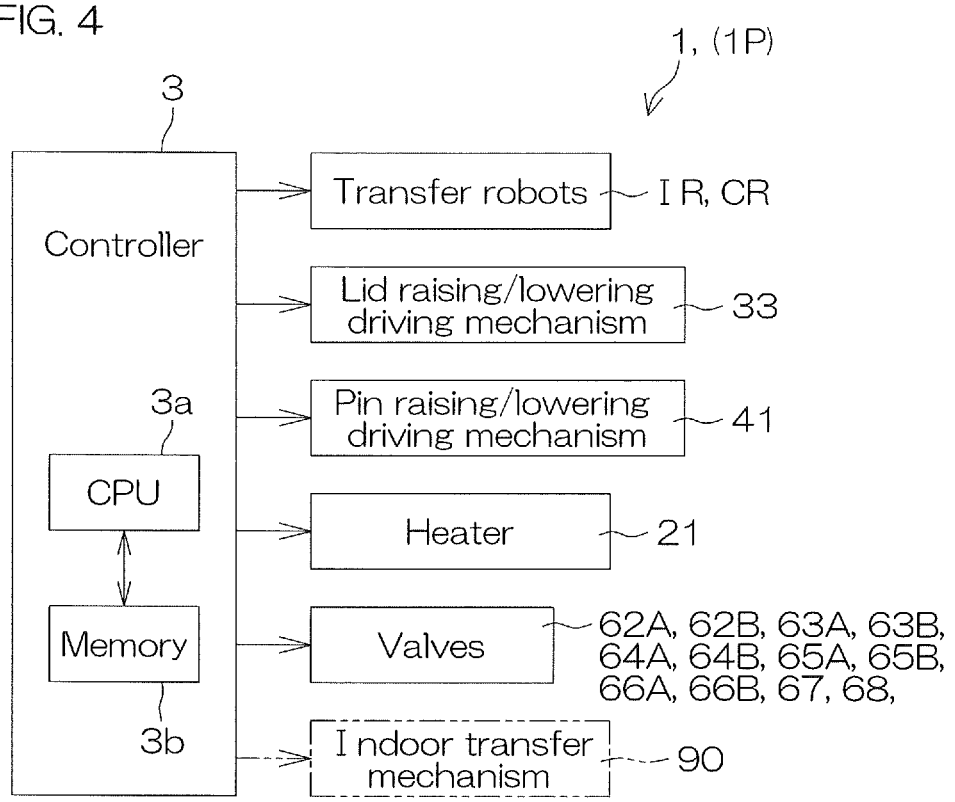
FIG. 4 is a block diagram for describing a configuration example with regard to control of the substrate processing apparatus.

FIG. 4 is a block diagram which shows an electrical configuration of major portions of the substrate processing apparatus 1. The controller 3 is provided with a microcomputer and controls controlled targets provided in the substrate processing apparatus 1 according to predetermined control programs.

Specifically, the controller 3 may be a computer which includes a processor (CPU) 3a and a memory 3b in which the control programs are stored. The controller 3 is configured so as to execute various types of control for substrate processing according to the control programs executed by the processor 3a.

Specific controlled targets of the controller 3 are the transfer robots IR, CR, the pin raising/lowering driving mechanism 41, the lid raising/lowering driving mechanism 33, the heater 21, the first inert gas valve 62A, the first inert gas flow rate adjusting valve 62B, the oxidizing fluid valve 63A, the oxidizing fluid flow rate adjusting valve 63B, the second inert gas valve 64A, the second inert gas flow rate adjusting valve 64B, the water valve 65A, the water flow rate adjusting valve 65B, the reactive gas valve 66A, the reactive gas flow rate adjusting valve 66B, the first fluid discharge valve 67, the second fluid discharge valve 68, etc.

Figure 5:
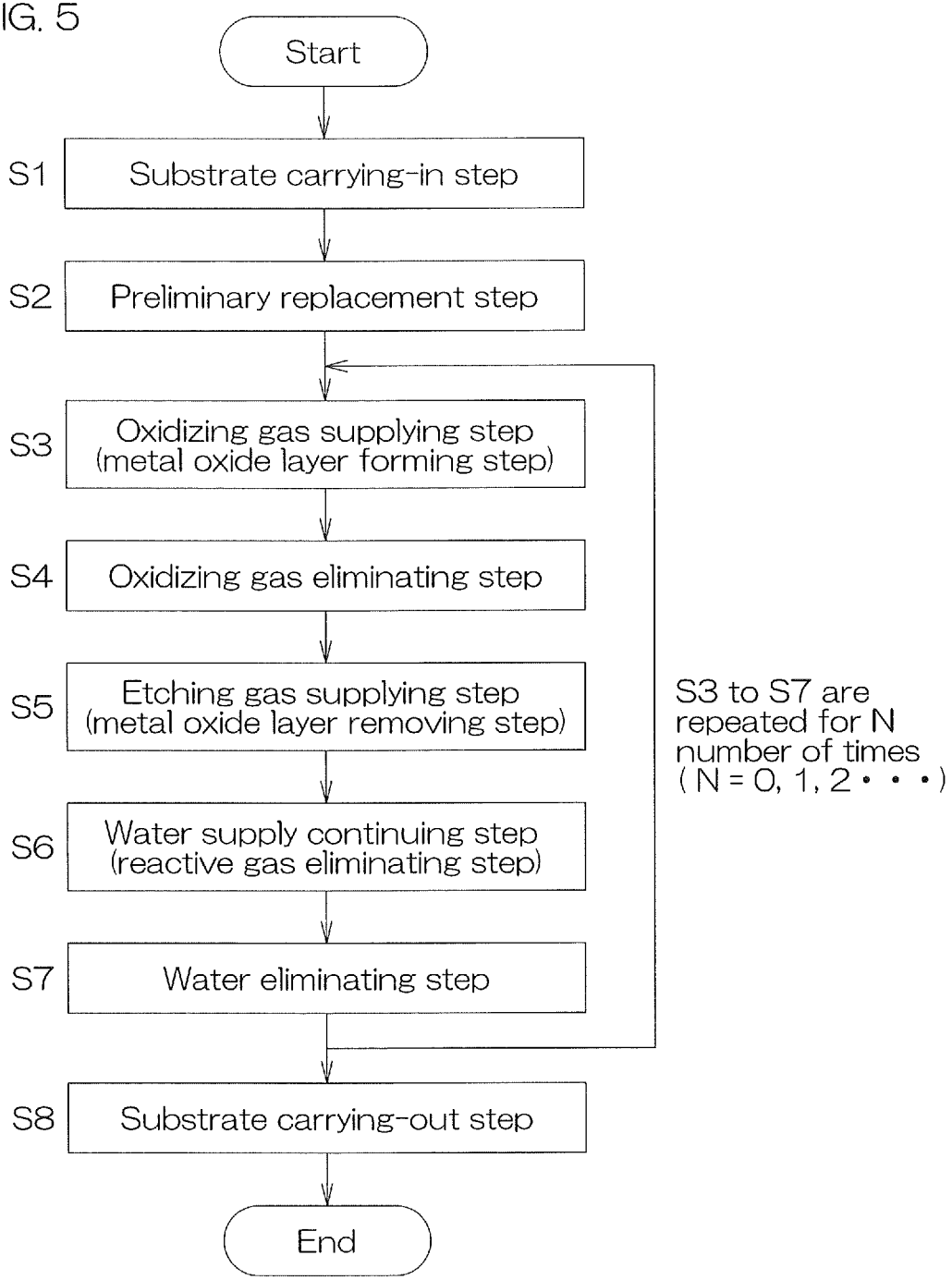
FIG. 5 is a flow chart for describing a flow of specific substrate processing by the substrate processing apparatus.

Hereinafter, a description will be given of an example of substrate processing in which the metal layer exposed from the first principal surface W1 of the substrate W is a gallium nitride layer, the oxidizing fluid is an ozone gas and the reactive gas is an ammonia gas. FIG. 5 is a flow chart for describing an example of the substrate processing executed by the substrate processing apparatus 1. FIG. 5 mainly shows the processing which is realized by the programs executed by the controller 3.

In the substrate processing by the substrate processing apparatus 1, for example, as shown in FIG. 5, first, a substrate carrying-in step (Step S1) and a preliminary replacement step (Step S2) are executed in this order. Thereafter, an oxidizing gas supplying step (Step S3), an oxidizing gas eliminating step (Step S4), an etching gas supplying step (Step S5), a water supply continuing step (Step S6) and a water eliminating step (Step S7) are executed at least once for each step in this order. Then, after the last step of the water eliminating step, a substrate carrying-out step (Step S8) is executed.

Figure 6:
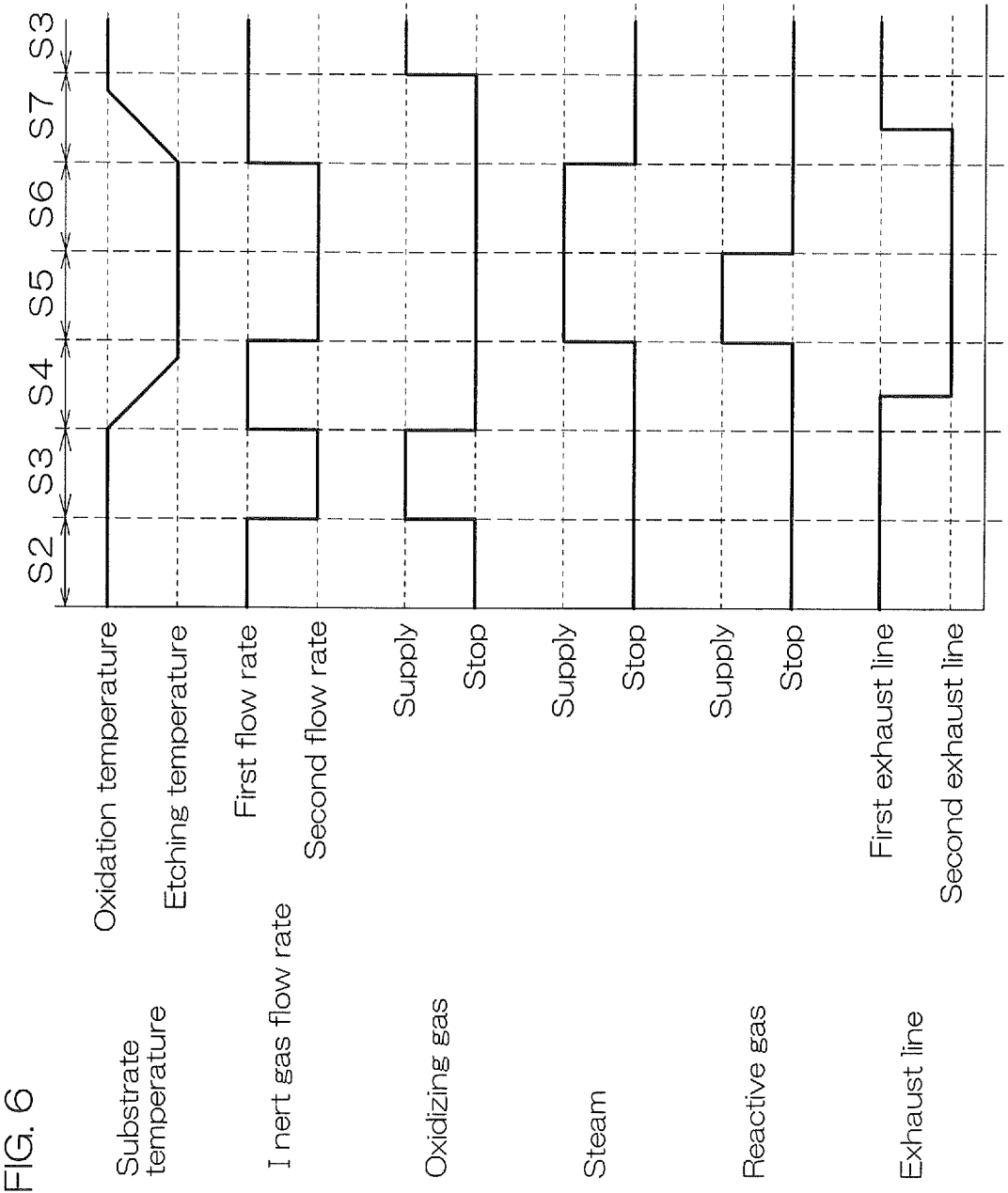
FIG. 6 is a time chart of steps executed inside a heat processing chamber in the substrate processing.

FIG. 6 is a time chart of steps which are executed inside the heat processing chamber 30 in the substrate processing. Hereinafter, FIG. 2, FIG. 5 and FIG. 6 are mainly referenced.

First, a substrate W which is not processed is carried into the processing unit 2 from the carrier C by the transfer robots IR, CR (refer to FIG. 1) (substrate carrying-in step: Step S1). The substrate W is placed on the heating surface 20a of the hot plate 20 in a state where the first principal surface W1 from which a gallium nitride layer is exposed is turned upward (substrate placing step).

Thereafter, the lid 32 is lowered to give a state where the substrate W is placed on the hot plate 20 inside the sealed processing space SP which is formed by the chamber main body 31 and the lid 32. The substrate W placed on the heating surface 20a is heated at a predetermined oxidation temperature (first temperature) by the hot plate 20 (substrate heating step). The predetermined oxidation temperature is, for example, a temperature which is 100° C. or higher and 400° C. or lower.

In a state where the sealed processing space SP is formed, the first fluid discharge valve 67 and the first inert gas valve 62A are opened. Thereby, while an inert gas is introduced from the first fluid introducing port 10A into the sealed processing space SP, an atmosphere inside the sealed processing space SP is discharged to the outside of the heat processing chamber 30 via the first fluid discharge port 15A. That is, before supply of an oxidizing gas to the sealed processing space SP, the atmosphere inside the sealed processing space SP is replaced with the inert gas (preliminary replacement step: Step S2).

Supply of the inert gas continues for a predetermined replacement time, by which the atmosphere inside the sealed processing space SP is sufficiently replaced with the inert gas and the sealed processing space SP is filled with the inert gas. The predetermined replacement time is, for example, 10 seconds or more and 120 seconds or less. The flow rate of the inert gas in the preliminary replacement step (preliminary replacement flow rate) is a first flow rate. The first flow rate is, for example, 5 L/min or more and 50 L/min or less. The preliminary replacement flow rate means a total flow rate of the inert gas introduced from the plurality of first fluid introducing ports 10A into the sealed processing space SP.

In a state where the sealed processing space SP is filled with the inert gas, the oxidizing fluid valve 63A is opened. Thereby, an ozone gas is introduced from the plurality of first fluid introducing ports 10A into the sealed processing space SP, and the ozone gas is supplied toward the first principal surface W1 of the substrate W (oxidizing gas supplying step: Step S3). The oxidizing gas supplying step is an example of an oxidizing fluid supplying step.

The first principal surface W1 of the substrate W is processed by the ozone gas ejected from the plurality of first fluid introducing ports 10A (oxidation processing step). Specifically, a gallium oxide layer constituted of one atomic layer or several atomic layers is formed on the surface layer of the gallium nitride layer exposed from the first principal surface W1 of the substrate W (metal oxide layer forming step, gallium oxide layer forming step). The substrate W is heated up to an oxidation temperature on the hot plate 20. Therefore, in the metal oxide layer forming step, a heating oxidation step in which the ozone gas is supplied toward the first principal surface W1 of the substrate W while the substrate W is heated at the oxidation temperature is executed.

The ozone gas is continuously introduced into the sealed processing space SP for a predetermined oxidation processing time. The predetermined oxidation processing time is, for example, 10 seconds or more and 300 seconds or less.

The flow rate of the oxidizing gas in the oxidizing gas supplying step is a predetermined oxidation flow rate. The oxidation flow rate is, for example, 5 L/min or more and 50 L/min or less. The oxidation flow rate means a total flow rate of the oxidizing gas introduced from all the first fluid introducing ports 10A into the sealed processing space SP.

During introduction of the oxidizing gas into the sealed processing space SP, the flow rate of the inert gas is adjusted to a first partial pressure adjusting flow rate. The first partial pressure adjusting flow rate is, for example, a second flow rate lower than the first flow rate. The second flow rate is, for example, 0 L/min or more and 50 L/min or less. The first partial pressure adjusting flow rate means a total flow rate of the inert gas introduced from the plurality of first fluid introducing ports 10A into the sealed processing space SP.

The flow rate of the inert gas is adjusted, by which a partial pressure of the ozone gas inside the sealed processing space SP can be adjusted to a partial pressure which is suitable for oxidizing a portion of one atomic layer or several atomic layers on the surface layer of the gallium nitride layer (ozone gas partial pressure adjusting step, oxidizing gas partial pressure adjusting step).

Even during supply of the ozone gas, since a state where the first fluid discharge valve 67 is opened is kept, the ozone gas inside the sealed processing space SP is exhausted from the first fluid discharge line 57 (first exhaust line).

After the first principal surface W1 of the substrate W is processed by the ozone gas, the oxidizing fluid valve 63A is closed. Thereby, while the inert gas is continuously ejected from the plurality of first fluid introducing ports 10A, ejection of the ozone gas is stopped.

The inert gas is supplied toward the principal surface of the substrate W, by which the atmosphere inside the sealed processing space SP is replaced with the inert gas, and the ozone gas is eliminated from the sealed processing space SP (oxidizing gas eliminating step: Step S4). The oxidizing gas eliminating step is an example of an oxidizing fluid eliminating step.

At the same time when the oxidizing fluid valve 63A is closed or after the oxidizing fluid valve 63A is closed, the first inert gas flow rate adjusting valve 62B is controlled to change the flow rate of the inert gas to a predetermined oxidizing fluid eliminating flow rate. The oxidizing fluid eliminating flow rate is, for example, the first flow rate. The oxidizing fluid eliminating flow rate means a total flow rate of the inert gas introduced from all the first fluid introducing ports 10A into the sealed processing space SP.

After the first principal surface W1 of the substrate W is processed by the ozone gas, while a state where the substrate W is placed on the heating surface 20a is kept, the hot plate 20 is lowered in temperature. Along with lowering of the temperature of the hot plate 20, the substrate W falls in temperature. Specifically, the temperature of the heater is changed to an etching temperature, by which the hot plate 20 and the substrate W gradually fall in temperature and reach the etching temperature (second temperature). As described above, the heating of the substrate W is weakened and the temperature of the substrate W is adjusted to a predetermined etching temperature which is lower than the oxidation temperature (temperature adjusting step, heating weakening step, low temperature heating step). The etching temperature is, for example, a temperature which is 25° C. or higher and 100° C. or lower.

The hot plate 20 functions as a temperature adjusting member which adjusts the temperature of the substrate W placed on the heating surface 20a as a temperature adjusting surface to the first temperature and the second temperature.

In the course of lowering the temperature of the substrate W, the first fluid discharge valve 67 is closed and the second fluid discharge valve 68 is opened. Thereby, an exhaust destination (exhaust line) of the atmosphere from the sealed processing space SP is changed from the first fluid discharge line 57 (first exhaust line) to the second fluid discharge line 58 (second exhaust line) (fluid discharge line changing step).

During the time when the substrate W is lowered in temperature, the first inert gas valve 62A is closed and the second inert gas valve 64A is opened. Thereby, ejection of the inert gas from the plurality of first fluid introducing ports 10A is stopped, and ejection of the inert gas from the plurality of second fluid introducing ports 10B is started. The second inert gas flow rate adjusting valve 64B is controlled, by which the flow rate of the inert gas introduced from the plurality of second fluid introducing ports 10B into the sealed processing space SP is adjusted to the first flow rate.

After the temperature of the substrate W has reached the etching temperature, the water valve 65A and the reactive gas valve 66A are opened. Thereby, an etching gas (mixed gas of steam and ammonia gas) is introduced from the plurality of second fluid introducing ports 10B into the sealed processing space SP, and the etching gas is thereby supplied toward the first principal surface W1 of the substrate W (etching gas supplying step: Step S5). The etching gas supplying step is an example of an etching fluid supplying step.

The first principal surface W1 of the substrate W is processed by the etching gas ejected from the plurality of second fluid introducing ports 10B (etching processing step). Specifically, the gallium oxide layer formed on the first principal surface W1 of the substrate W is etched to selectively remove the gallium oxide layer (metal oxide layer removing step, gallium oxide layer removing step). In the metal oxide layer removing step, in a state where the temperature of the substrate W is the etching temperature, the gallium oxide layer is etched (low temperature etching step).

Introduction of the etching gas into the sealed processing space SP continues for a predetermined etching processing time. The predetermined etching processing time is, for example, 5 seconds or more and 120 seconds or less.

The flow rate of steam in the etching gas supplying step is a predetermined first etching flow rate. The first etching flow rate is, for example, 5 L/min or more and 50 L/min or less. The flow rate of steam in the etching gas supplying step means a total flow rate of steam introduced from all the second fluid introducing ports 10B into the sealed processing space SP.

The flow rate of the ammonia gas in the etching gas supplying step is a predetermined second etching flow rate. The second etching flow rate is, for example, 1 L/min or more and 50 L/min or less. The flow rate of the ammonia gas in the etching gas supplying step means a total flow rate of the ammonia gas introduced from all the second fluid introducing ports 10B into the sealed processing space SP.

During the time when the etching gas is introduced from the plurality of second fluid introducing ports 10B into the sealed processing space SP, the opening degree of the second inert gas flow rate adjusting valve 64B is adjusted, by which the flow rate of the inert gas is adjusted to a second partial pressure adjusting flow rate. The second partial pressure adjusting flow rate is lower than the preliminary replacement flow rate and, for example, the second flow rate. The second partial pressure adjusting flow rate means a total flow rate of the inert gas introduced from the plurality of second fluid introducing ports 10B into the sealed processing space SP.

The flow rate of the inert gas is adjusted, by which a partial pressure of steam and a partial pressure of the ammonia gas inside the sealed processing space SP can be adjusted to a partial pressure which is suitable for selective etching of the gallium oxide layer (etching gas partial pressure adjusting step).

A temperature of steam ejected from the plurality of second fluid introducing ports 10B is higher than the temperature (etching temperature) of the substrate W in the etching gas supplying step. Therefore, the steam is lowered in temperature in the vicinity of the first principal surface W1 of the substrate W to produce water in a fine liquid state.

As long as an ammonia gas which is dissolved into the water in a fine mist state $1\times10^{-6}$ mol/L or more and 15 mol/L or less in concentration, the gallium oxide layer having a thickness of one atomic layer or several atomic layers can be selectively etched. The ammonia gas which is dissolved into the water in a fine mist state is in particular preferably 1 mol/L in concentration.

After the gallium oxide layer is removed from the first principal surface W1 of the substrate W, while the water valve 65A is kept open, the reactive gas valve 66A is closed. Thereby, introduction of the ammonia gas from the plurality of second fluid introducing ports 10B into the sealed processing space SP is stopped, and introduction of the steam from the plurality of second fluid introducing ports 10B into the sealed processing space SP continues (steam supply continuing step: Step S6). After the metal oxide layer removing step, the steam is introduced continuously into the sealed processing space SP, thereby eliminating the reactive gas from the sealed processing space SP (reactive gas eliminating step, ammonia gas eliminating step).

After supply of the reactive gas is stopped, introduction of the steam into the sealed processing space SP continues for a predetermined water continuous supply time. The predetermined water continuous supply time is, for example, 10 seconds or more and 120 seconds or less.

During the time when the steam is continuously supplied to the sealed processing space SP, the opening degree of the second inert gas flow rate adjusting valve 64B is adjusted, by which the flow rate of the inert gas is adjusted to a predetermined ammonia gas eliminating flow rate. The ammonia gas eliminating flow rate is, for example, the second flow rate which is equal to the second partial pressure adjusting flow rate. The flow rate of the inert gas in the steam supply continuing step means a total flow rate of the inert gas introduced from the plurality of second fluid introducing ports 10B into the sealed processing space SP.

After supply of the steam has continued for a predetermined water continuous supply time, the water valve 65A is closed. Thereby, supply of the steam to the sealed processing space SP is stopped. On the other hand, the inert gas is continuously supplied to the sealed processing space SP, and therefore the steam is eliminated from the sealed processing space SP (water eliminating step, steam eliminating step: Step S7).

At the same time when the water valve 65A is closed or after the water valve 65A is closed, heating of the substrate W is strengthened to adjust the temperature of the substrate W to the oxidation temperature (heating strengthening step). Specifically, the temperature of the heater is changed to the predetermined etching temperature, by which the temperatures of the hot plate 20 and the substrate W gradually rise and reach the predetermined oxidation temperature.

In the course of raising the temperature of the substrate W, the second fluid discharge valve 68 is closed and the first fluid discharge valve 67 is opened. Thereby, an exhaust destination (exhaust line) of the atmosphere from the sealed processing space SP is changed from the second fluid discharge line 58 (second exhaust line) to the first fluid discharge line 57 (first exhaust line) (fluid discharge line changing step).

At the same time when the water valve 65A is closed or after the water valve 65A is closed, the flow rate of the inert gas is changed to a predetermined water eliminating flow rate. The water eliminating flow rate is, for example, the first flow rate. The flow rate of the inert gas in the water eliminating step means a total flow rate of the inert gas introduced from all the second fluid introducing ports 10B into the sealed processing space SP.

Thereafter, the oxidizing gas supplying step (Step S3) to the water eliminating step (Step S7) may be again executed at least once for each step. "N" shown in FIG. 5 means an integer which is 0 or more (N=0, 1, 2 . . . ). The cycle processing is executed at least once in total and, thereafter, the substrate carrying-out step (Step S8) is executed without execution of the heating strengthening step in the last step of the water eliminating step (Step S7). The substrate W which has been carried out from the heat processing unit 5 is delivered from the transfer robot CR to the transfer robot IR and housed in the carrier C by the transfer robot IR.

Figure 7:
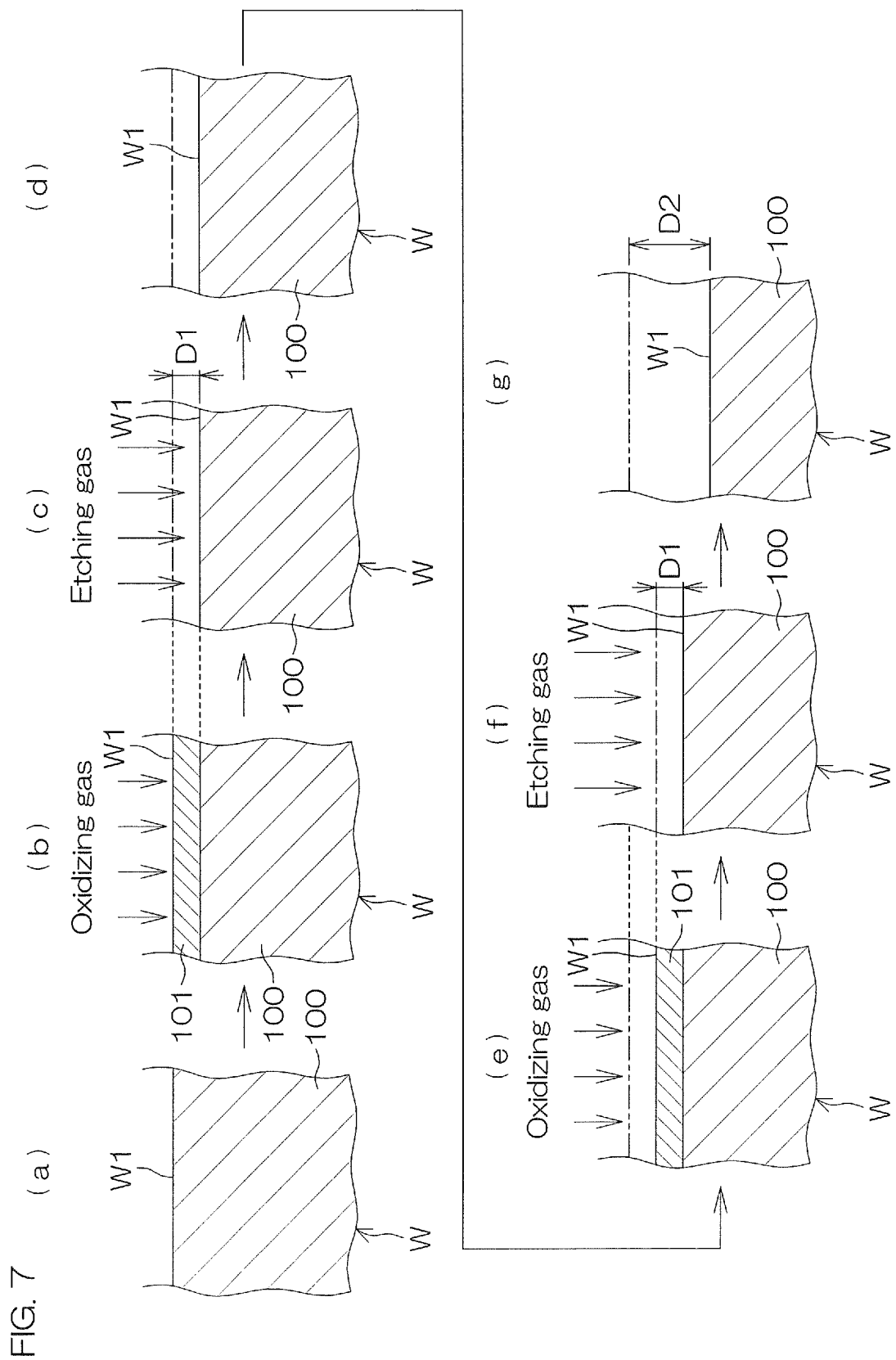
FIG. 7 is a schematic view for describing a change in state of a front surface of the substrate by repetition of a metal oxide layer forming step and a metal oxide layer removing step in the substrate processing.

FIG. 7 is a schematic view for describing a change in state of the front surface of the substrate W due to repetition of the metal oxide layer forming step and the metal oxide layer removing step in the substrate processing.

A change in conditions of a surface layer of a gallium nitride layer 100 by the metal oxide layer forming step (Step S3) and the metal oxide layer removing step (Step S5) will be described with reference to FIG. 7. As shown in FIG. 7(a) and FIG. 7(b), an ozone gas (oxidizing gas) is supplied to a first principal surface W1 of a substrate W, thereby forming a gallium oxide layer 101 constituted of one atomic layer or several atomic layers on the surface layer of the gallium nitride layer 100 (metal oxide layer forming step). A thickness D1 of the gallium oxide layer 101 is 0.3 nm or more and 5 nm or less.

In the metal oxide layer forming step, the gallium oxide layer 101 constituted of one atomic layer or several atomic layers is formed. A thickness of the gallium nitride layer 100 with one atomic layer is substantially equal to a thickness of the gallium oxide layer 101 with one atomic layer. The thickness of the gallium oxide layer 101 with one atomic layer is 1 nm or less (for example, 0.3 nm to 0.4 nm). As described above, several atomic layers refer to layers from two atomic layers to 10 atomic layers.

Then, as shown in FIG. 7(c) and FIG. 7(d), an etching gas is supplied toward the gallium oxide layer 101, thereby selectively removing the gallium oxide layer 101 from the substrate W (metal oxide layer removing step). That is, the entire gallium oxide layer 101 with one atomic layer or several atomic layers formed on the surface layer of the gallium nitride layer 100 is removed. As described above, the cycle processing in which the metal oxide layer forming step and the metal oxide layer removing step are given as one cycle is executed in one cycle, thereby etching the gallium nitride layer 100 by the thickness D1 of one atomic layer or several atomic layers.

Thereafter, as shown in FIG. 7(e) and FIG. 7(f), the cycle processing is executed further in one cycle, thereby etching the gallium nitride layer 100 by the thickness D1 of one atomic layer or several atomic layers. The thickness D1 of the gallium nitride layer 100 which is etched by executing the cycle processing in one cycle is substantially constant.

Where the cycle processing is executed a plural number of cycle times, as shown in FIG. 7(g), a portion of a thickness D2 which corresponds to a product of the thickness D1 by the number of cycle times (three cycles in FIG. 7(g)) is removed from the substrate W (D2=D1×the number of cycle times) on the surface layer of the gallium nitride layer 100. An amount of the gallium nitride layer 100 which is etched by the cycle processing executed a plural number of cycle times corresponds to the thickness D2.

Therefore, it is possible to achieve a desired etching amount (the same amount as the thickness D2) by adjusting the number of times in which the metal oxide layer forming step and the metal oxide layer removing step are repeatedly executed.

For example, where the cycle processing is executed in one cycle to etch the gallium nitride layer 100 by 0.3 nm, the number of cycle times in which the cycle processing is executed can be adjusted to execute the substrate processing in which the gallium nitride layer 100 is etched by 1.5 nm or the substrate processing in which the gallium nitride layer 100 is etched by 1.8 nm. That is, it is possible to control the etching amount of the gallium nitride layer 100 for each cycle at an accuracy of a nanometer or less.

Further, in this substrate processing method, in order to selectively remove the gallium oxide layer 101, an etching gas containing steam and a reactive gas is used.

Unlike this substrate processing method, in a configuration in which water in a liquid state and a reactive liquid are supplied in a continuous flow to a first principal surface W1 of a substrate W, irregularities occur at an interface between the water in a liquid state and the first principal surface W1 of the substrate W. Therefore, at the molecular level, at each position of the principal surface W1 of the substrate W, the collision frequency between the principal surface W1 of the substrate W and water molecules and reactive molecules becomes uneven.

Further, in the heat processing unit 5, the substrate W is not rotated during heat processing. Therefore, where water in a liquid state and a reactive liquid are supplied in a continuous flow to the first principal surface W1 of the substrate W, the first principal surface W1 of the substrate W may not be dried sufficiently, resulting in occurrence of water marks.

As compared with water in a liquid state, steam easily scatters in the vicinity of the first principal surface W1 of the substrate W. Therefore, water molecules easily collide evenly at each position of the first principal surface W1 of the substrate W. Accordingly, as compared with a case where a liquid is used for removing the gallium oxide layer 101, it is possible to suppress unevenness in the etching amount on the first principal surface W1 of the substrate W at an accuracy of a nanometer or less. In particular, where the cycle processing is executed a plural number of cycle times, a remarkable effect on suppressing unevenness in the etching amount on the first principal surface W1 of the substrate W can be obtained.

Even where a substance which constitutes the metal nitride layer is a nitride of the Group III metals other than gallium nitride, as described above, it is possible to perform etching at an accuracy of a nanometer or less by using steam and a reactive gas.

As described above, the cycle processing is executed at least in one cycle, thus making it possible to satisfactorily control the etching amount of a metal nitride layer of the Group III metals at each position of the first principal surface W1 of the substrate W at an accuracy of a nanometer or less.

Where a hydrogen chloride gas is used as the reactive gas, it is necessary to provide a silicon carbide film on an inner wall of the heat processing chamber 30 to protect the heat processing chamber from corrosion resulting from hydrogen chloride. On the other hand, where an ammonia gas is used as the reactive gas, it is not necessary to provide a protective film such as a silicon carbide film on the inner wall of the heat processing chamber 30. Therefore, it is possible to reduce the cost of the substrate processing apparatus 1.

According to the first preferred embodiment, instead of replacing the entire etching gas with another gas, steam which constitutes the etching gas is continuously supplied to eliminate a reactive gas from the sealed processing space SP (reactive gas eliminating step). Thereby, components of the reactive gas adhered to the first principal surface W1 of the substrate W can be adsorbed by water and quickly removed.

According to the first preferred embodiment, after the reactive gas eliminating step, steam present in the sealed processing space SP is replaced with an inert gas to eliminate the steam from the sealed processing space SP (water eliminating step). Therefore, it is possible to suppress unintended etching of the metal nitride layer by oxygen molecules that are slightly dissolved into water molecules or water.

According to the first preferred embodiment, after the metal oxide layer forming step and also before the metal oxide layer removing step, the inert gas is supplied to the first principal surface W1 of the substrate W, by which the oxidizing gas present in the sealed processing space SP is replaced with the inert gas. Thereby, before the metal oxide layer removing step, the oxidizing gas is eliminated from the sealed processing space SP (oxidizing gas eliminating step). It is therefore possible to suppress unintended oxidation of the metal nitride layer in the metal oxide layer removing step.

According to the first preferred embodiment, in the metal oxide layer removing step, the temperature of the substrate W is adjusted to a temperature lower than that of the etching gas supplied from the etching fluid supplying unit toward the first principal surface W1 of the substrate W (temperature adjusting step). Therefore, since the etching gas is lowered in temperature in the vicinity of the first principal surface W1 of the substrate W, reactive molecules and water molecules are decreased in kinetic energy in the vicinity of the first principal surface W1 of the substrate W. Therefore, the reactive molecules and the water molecules adsorbed onto the first principal surface W1 of the substrate W are prevented from separating from the first principal surface W1 of the substrate W. In other words, adsorption of the reactive molecules and the water molecules onto the first principal surface W1 of the substrate W is accelerated. Thereby, the metal nitride layer can be increased in etching speed. As a result, while the etching amount for one cycle of the cycle processing is kept to one atomic layer or several atomic layers, the metal nitride layer can be increased in etching speed.

According to the first preferred embodiment, in the metal oxide layer forming step, while the substrate W is heated at the oxidation temperature (first temperature), the oxidizing gas is supplied toward the first principal surface W1 of the substrate W, thereby forming the metal oxide layer (heating oxidation step). Then, in the metal oxide layer removing step, in a state where the temperature of the substrate W is the etching temperature (second temperature), the etching fluid is supplied toward the first principal surface W1 of the substrate W to etch the metal oxide layer (low temperature etching step).

Specifically, the metal nitride layer on the first principal surface W1 of the substrate W is oxidized when the temperature of the substrate W is the oxidation temperature which is a relatively high temperature (for example, 100° C. or higher and 400° C. or lower), and etching is performed when the temperature of the substrate W is the etching temperature which is a relatively low temperature (for example, 25° C. or higher and 100° C. or lower).

Therefore, in the metal oxide layer forming step, the metal nitride layer can be increased in oxidation speed. On the other hand, as long as the substrate W is relatively high in temperature in the metal oxide removing step, oxygen slightly contained in the etching fluid has oxidizing power, and etching is performed at a relatively low temperature. Therefore, it is possible to suppress unintended oxidation of the metal nitride layer in the metal oxide layer removing step.

According to the first preferred embodiment, in a state where the substrate W is placed on the heating surface 20a of the single hot plate 20, the substrate W is heated and the substrate W is also lowered in temperature. Therefore, the substrate processing can be made simple, as compared with a configuration in which the substrate W is moved to a member different from the hot plate 20 in order to change the temperature of the substrate W.

Further, according to the first preferred embodiment, the cycle processing in which the metal oxide layer forming step and the metal oxide layer removing step are given as one cycle is automatically executed by the controller 3 for a desired number of cycle times. Therefore, the number of cycle times for executing the metal oxide layer forming step and the metal oxide layer removing step can be adjusted to achieve a desired etching amount.

Figure 8:
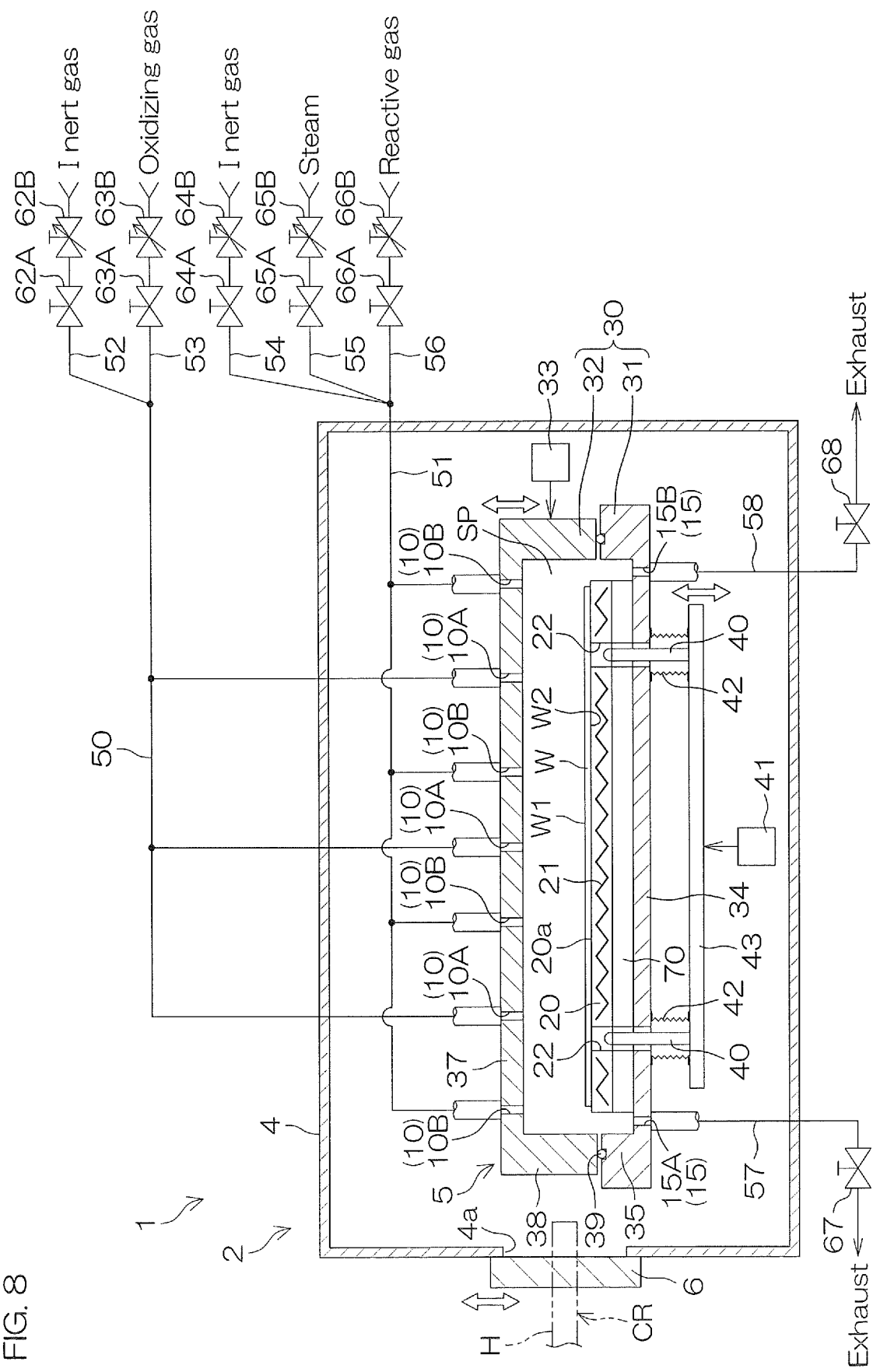
FIG. 8 is a schematic cross-sectional view which shows a modified example of the heat processing unit.

FIG. 8 is a schematic cross-sectional view which shows a modified example of the heat processing unit 5 according to the first preferred embodiment. The heat processing unit 5 according to the modified example may include a cool plate 70 which is in contact with the hot plate 20 to lower a temperature of the hot plate 20. The cool plate 70 is interposed between the supporting portion 34 of the chamber main body 31 and the hot plate 20. A refrigerant channel (not shown) in which a refrigerant (typically, cooling water) circulates is formed inside the cool plate 70.

Where the heat processing unit 5 according to this modified example is used to execute the substrate processing, the heater of the hot plate 20 is not changed in output and circulation of cooling water is started, thus making it possible to quickly lower the temperature of the hot plate 20. That is, it is possible to quickly lower the temperature of the substrate W.

Figure 9:
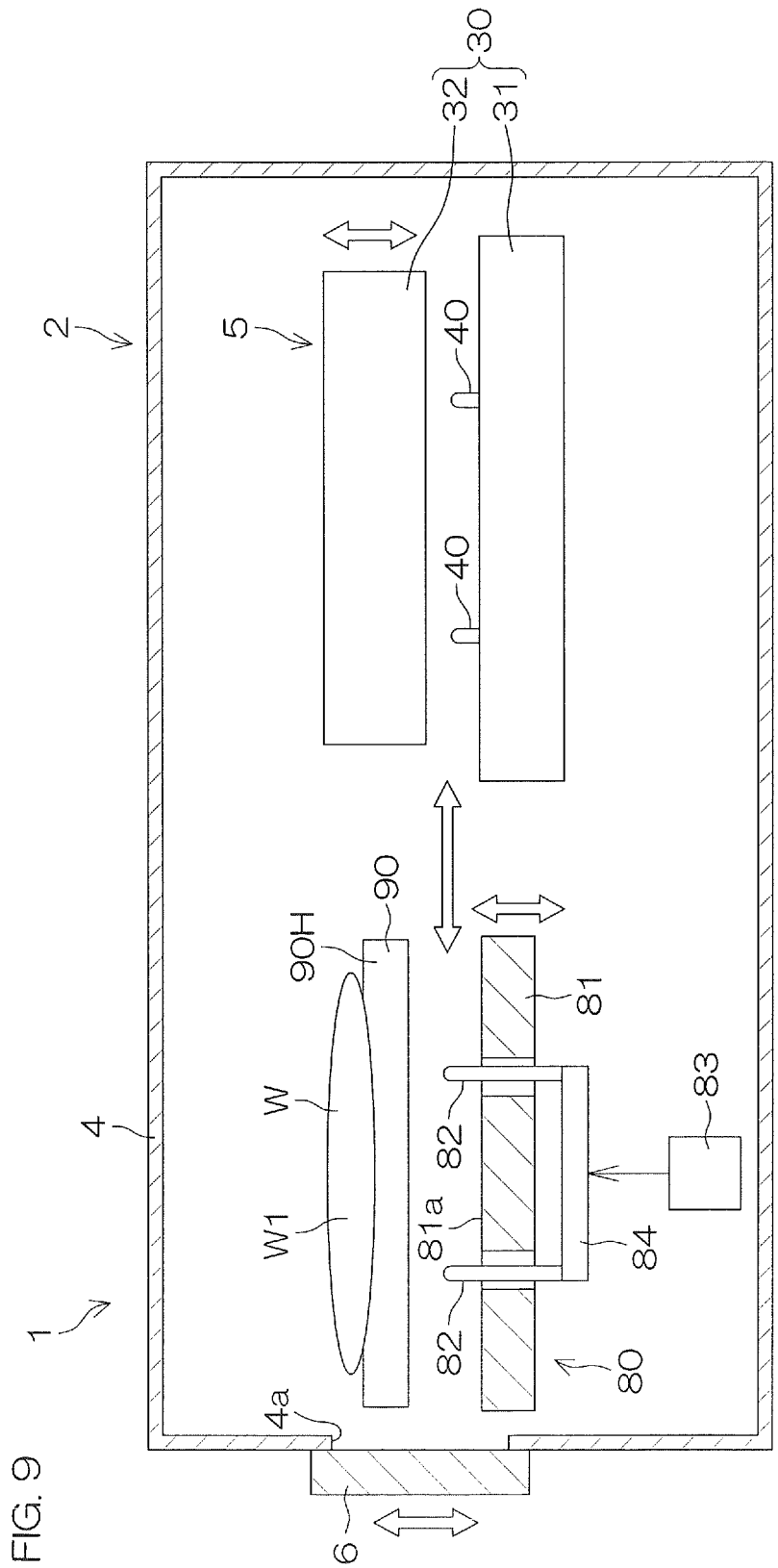
FIG. 9 is a schematic cross-sectional view which shows a modified example of a processing unit provided in the substrate processing apparatus.

FIG. 9 is a schematic cross-sectional view which shows a modified example of the processing unit 2 according to the first preferred embodiment. As shown in FIG. 9, the processing unit 2 may further include a cooling unit 80 which cools the substrate W heated by the heat processing unit 5 inside the dry chamber 4 and an indoor transfer mechanism 90 which transfers the substrate W inside the dry chamber 4. The cooling unit 80 is disposed inside the dry chamber 4 in the vicinity of the carrying-in/carrying-out port 4a.

The cooling unit 80 includes a cool plate 81, a plurality of lift pins 82 which penetrate through the cool plate 81 to move up and down and a pin raising/lowering driving mechanism 83 which moves the lift pins 82 up and down. The cool plate 81 has a cooling surface 81a on which the substrate W is placed. The plurality of lift pins 82 are coupled by a coupling plate 84.

A refrigerant channel (not shown) in which a refrigerant (typically, cooling water) circulates is formed inside the cool plate 81. The plurality of lift pins 82 are moved up and down between an upper position in which the substrate W is supported higher than the cooling surface 81a and a lower position in which the tips thereof sink down lower than the cooling surface 81a.

The indoor transfer mechanism 90 transfers the substrate W inside the dry chamber 4. More specifically, the indoor transfer mechanism 90 is provided with an indoor transfer hand 90H which transfers the substrate W between the cooling unit 80 and the heat processing unit 5. The indoor transfer hand 90H is configured so as to receive and deliver the substrate W from and to the plurality of lift pins 82 of the cooling unit 80 and also so as to receive and deliver the substrate W from and to the lift pins 40 of the heat processing unit 5. Thereby, the indoor transfer hand 90H can be operated so as to receive the substrate W from the lift pins 82 of the cooling unit 80 and deliver the substrate W to the lift pins 40 of the heat processing unit 5. The indoor transfer hand 90H can also be operated so as to receive the substrate W from the lift pins 40 of the heat processing unit 5 and deliver the substrate W to the lift pins 82 of the cooling unit 80.

When the transfer robot CR (refer to FIG. 1) carries the substrate W into the dry chamber 4, the shutter 6 is controlled to an open position in which the carrying-in/carrying-out port 4a is opened. In this state, the hand H of the transfer robot CR enters into the dry chamber 4 and disposes the substrate W above the cool plate 81. Then, the plurality of lift pins 82 are raised to the upper position and receive the substrate W from the hand H of the transfer robot CR. Thereafter, the hand H of the transfer robot CR moves back outside the dry chamber 4.

Next, the indoor transfer hand 90H of the indoor transfer mechanism 90 receives the substrate W from the plurality of lift pins 82 and transfers the substrate W to the heat processing unit 5. At this time, the lid 32 is positioned at the open position (upper position) and the plurality of lift pins 40 support the received substrate W at the upper position. After the indoor transfer hand 90H has retreated from the heat processing chamber 30, the lift pins 40 are lowered to the lower position to place the substrate W on the heating surface 20a (refer to FIG. 2). On the other hand, the lid 32 is lowered to the closed position (lower position) to form the sealed processing space SP which internally contains the hot plate 20. In this state, heat processing is given to the substrate W (for example, Step S2 to Step S8 in FIG. 4).

After the heat processing is completed, the lid 32 is raised to the open position (upper position) to open the heat processing chamber 30. Further, the plurality of lift pins 40 are raised to the upper position to push up the substrate W above the heating surface 20a. In this state, the indoor transfer hand 90H of the indoor transfer mechanism 90 receives the substrate W from the plurality of lift pins 40 and transfers the substrate W to the plurality of lift pins 82 of the cooling unit 80. The cooling unit 80 supports the received substrate W at the upper position. After the indoor transfer hand 90H has retreated, the plurality of lift pins 82 are lowered to the lower position and, thereby, the substrate W is placed on the cooling surface 81a of the cool plate 81. Thus, the substrate W is cooled.

After the substrate W is completely cooled, the lift pins 82 are raised to the upper position, thereby pushing up the substrate W above the cooling surface 81a. In this state, the shutter 6 is opened, the hand H of the transfer robot CR enters into the dry chamber 4 and is disposed below the substrate W supported by the lift pins 82 positioned at the upper position. In this state, the lift pins 82 are lowered and, thereby, the substrate W is delivered to the hand H of the transfer robot CR. The hand H which holds the substrate W retreats outside the dry chamber 4 and, thereafter, the shutter 6 closes the carrying-in/carrying-out port 4a.

Second Preferred Embodiment

Hereinafter, a description will be given of a configuration of a substrate processing apparatus 1P according to the second preferred embodiment of the present invention.

Figure 10:
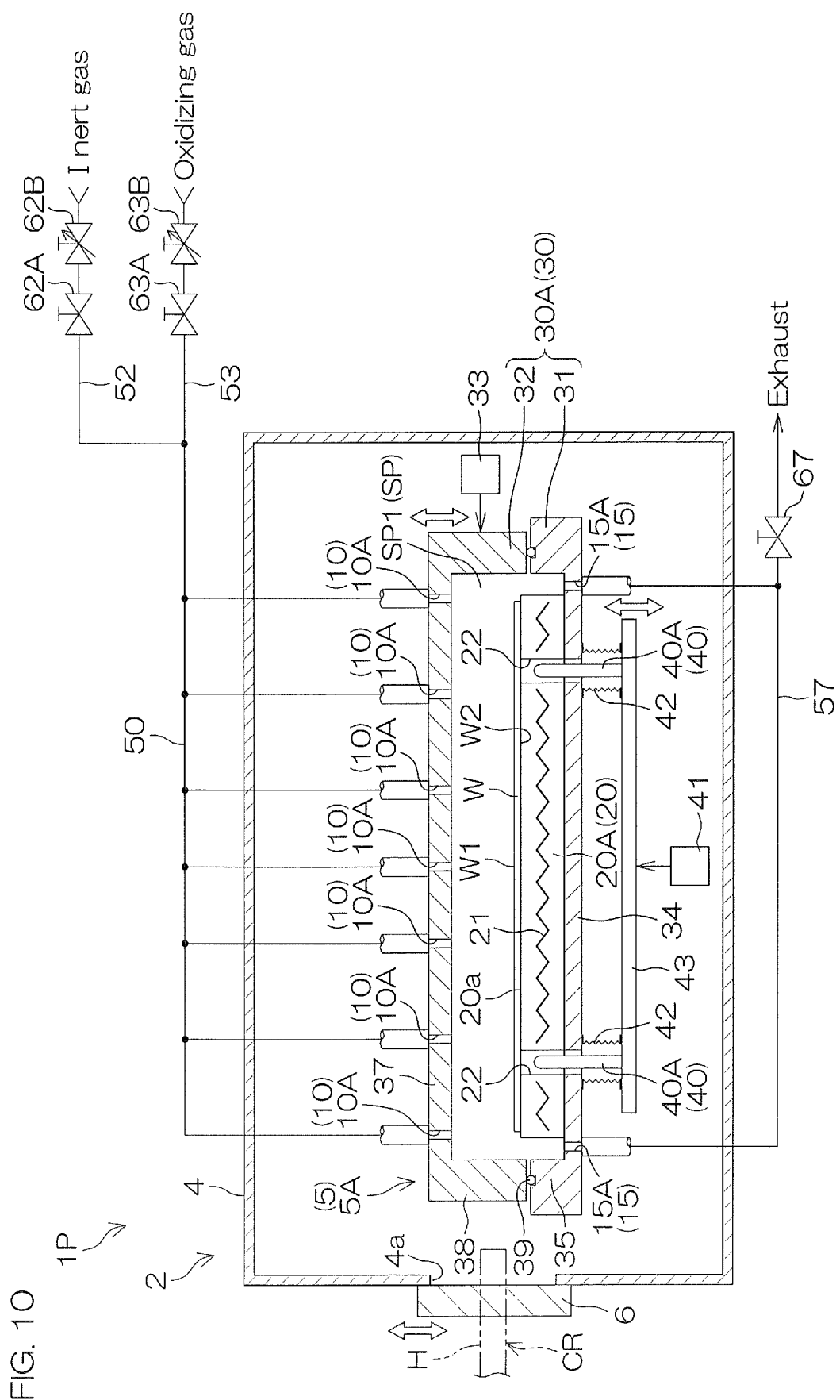
FIG. 10 is a schematic cross-sectional view for describing a configuration example of a first heat processing unit provided in a substrate processing apparatus according to a second preferred embodiment.
Figure 11:
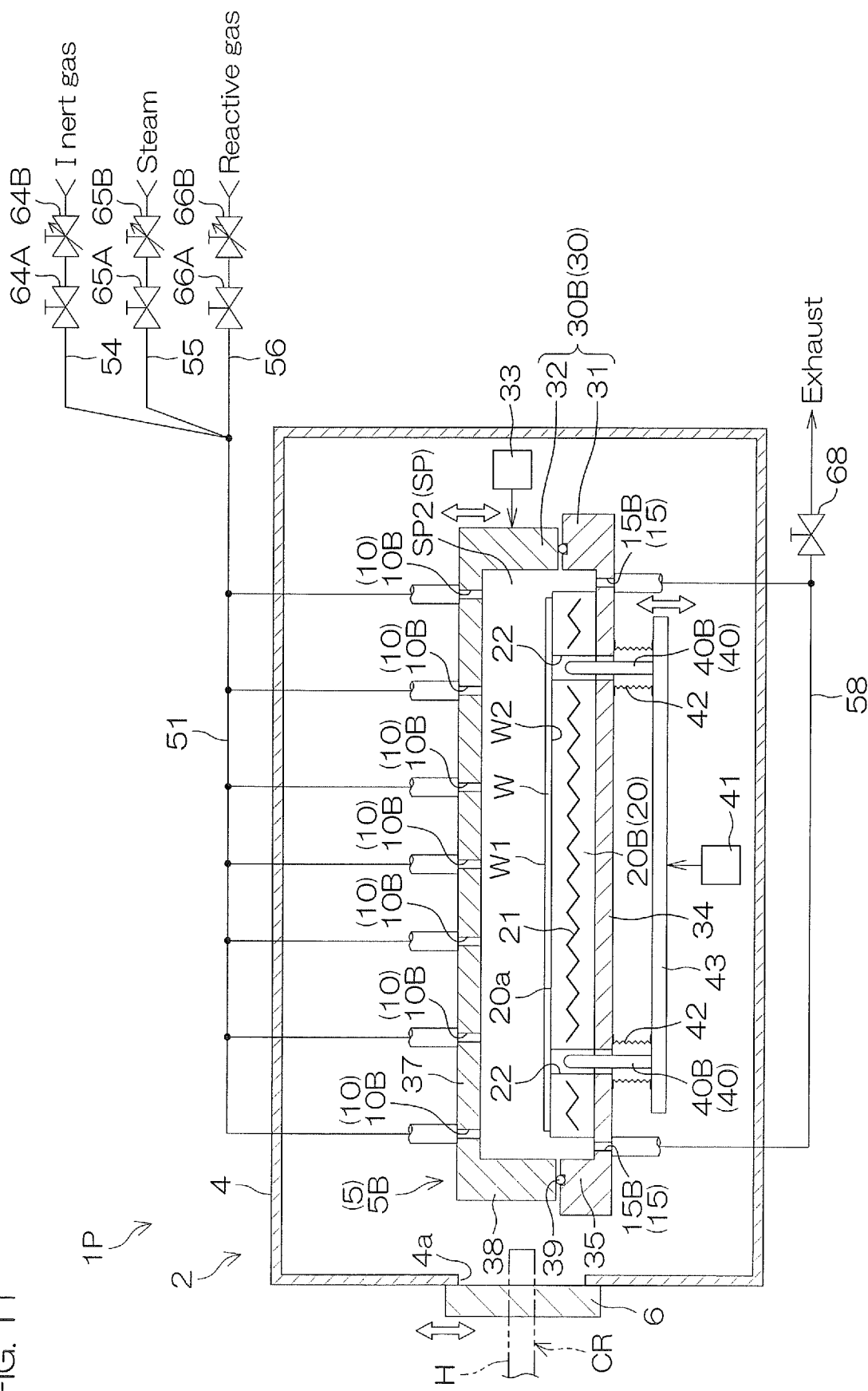
FIG. 11 is a schematic cross-sectional view for describing a configuration example of a second heat processing unit provided in the substrate processing apparatus according to the second preferred embodiment.

The substrate processing apparatus 1P according to the second preferred embodiment is different from the substrate processing apparatus 1 according to the first preferred embodiment mainly in that a heat processing unit 5 of the substrate processing apparatus 1P includes a first heat processing unit 5A (refer to FIG. 10) and a second heat processing unit 5B (refer to FIG. 11). FIG. 10 is a schematic cross-sectional view for describing a configuration example of the first heat processing unit 5A. FIG. 11 is a schematic cross-sectional view for describing a configuration example of the second heat processing unit 5B. In FIG. 10 and FIG. 11 as well as FIG. 12 which is to be described later, a configuration in common with the configurations shown in FIG. 1 to FIG. 9 described previously shall be provided with the same reference signs as those of FIG. 1, etc., and a description thereof shall be omitted.

With reference to FIG. 10, the first heat processing unit 5A is different from the heat processing unit 5 according to the first preferred embodiment mainly in that no second fluid line 51 (refer to FIG. 2) is provided in the first heat processing unit 5A and a first fluid line 50 is connected to all fluid introducing ports 10 of the first heat processing unit 5A. That is, the fluid introducing ports 10 provided in the first heat processing unit 5A are all first fluid introducing ports 10A. Further, fluid discharge ports 15 provided in the first heat processing unit 5A are all first fluid discharge port 15A for exhausting mainly an oxidizing gas.

Hereinafter, a heat processing chamber 30, a sealed processing space SP, a hot plate 20 and a lift pin 40 provided in the first heat processing unit 5A are also referred to, respectively, as a first heat processing chamber 30A (first chamber), a first sealed processing space SP1, a first hot plate 20A and a first lift pin 40A.

With reference to FIG. 11, the second heat processing unit 5B is different from the heat processing unit 5 according to the first preferred embodiment mainly in that no first fluid line 50 is provided in the second heat processing unit 5B and a second fluid line 51 is connected to all fluid introducing ports 10 of the second heat processing unit 5B. That is, the fluid introducing ports 10 provided in the second heat processing unit 5B are all second fluid introducing ports 10B. Further, fluid discharge ports 15 provided in the second heat processing unit 5B are all second fluid discharge ports 15B for exhausting mainly an etching gas.

Hereinafter, a heat processing chamber 30, a sealed processing space SP, a hot plate 20 and a lift pin 40 provided in the second heat processing unit 5B are also referred to, respectively, as a second heat processing chamber 30B (second chamber), a second sealed processing space SP2, a second hot plate 20B and a second lift pin 40B.

Substrate processing by the substrate processing apparatus 1P according to the second preferred embodiment is different from that by the substrate processing apparatus 1 according to the first preferred embodiment. Specifically, a metal oxide layer forming step and a metal oxide layer removing step are each executed by a different heat processing unit 5. FIG. 12 is a flow chart for describing an example of substrate processing executed by the substrate processing apparatus 1P.

In the substrate processing by the substrate processing apparatus 1P, for example, as shown in FIG. 12, first, a first substrate carrying-in step (Step S11), a first preliminary replacement step (Step S12), an oxidizing gas supplying step (Step S13), an oxidizing gas eliminating step (Step S14), a first substrate carrying-out step (Step S15), a second substrate carrying-in step (Step S16), a second preliminary replacement step (Step S17), an etching gas supplying step (Step S18), a water supply continuing step (Step S19), a water eliminating step (Step S20) and a second substrate carrying-out step (Step S21) are executed in this order each at least once.

Hereinafter, FIG. 10 to FIG. 12 are mainly referenced.

First, a substrate W which is not processed is carried into the first heat processing unit 5A from a carrier C by transfer robots IR, CR (refer to FIG. 1) (first substrate carrying-in step: Step S11). The substrate W is placed on a heating surface 20a of the first hot plate 20A in a state where a first principal surface W1 from which gallium nitride is exposed is turned upward (first substrate placing step).

Thereafter, a lid 32 of the first heat processing chamber 30A is lowered to give a state where the substrate W is placed on the first hot plate 20A inside the first sealed processing space SP1 which is formed by a chamber main body 31 and the lid 32. The substrate W placed on the heating surface 20a is heated at a predetermined oxidation temperature by the first hot plate 20A (substrate heating step). The predetermined oxidation temperature is, for example, a temperature which is 100° C. or higher and 400° C. or lower. The first hot plate 20A is an example of a first temperature adjusting member, and the heating surface 20a of the first hot plate 20A is an example of a first temperature adjusting surface.

In a state where the first sealed processing space SP1 is formed, a first fluid discharge valve 67 and a first inert gas valve 62A are opened. Thereby, while an inert gas is introduced from the plurality of first fluid introducing ports 10A into the first sealed processing space SP1, an atmosphere inside the first sealed processing space SP1 is discharged to the outside of the heat processing chamber 30 via the plurality of first fluid discharge ports 15A. That is, before an oxidizing gas is supplied to the first sealed processing space SP1, the atmosphere inside the first sealed processing space SP1 is replaced with the inert gas (first preliminary replacement step: Step S12).

The inert gas is supplied continuously for a predetermined first replacement time, by which the atmosphere inside the first sealed processing space SP1 is sufficiently replaced with the inert gas and the first sealed processing space SP1 is filled with the inert gas. The predetermined first replacement time is, for example, 10 seconds or more and 120 seconds or less. A flow rate of the inert gas in the first preliminary replacement step (first preliminary replacement flow rate) is a predetermined first flow rate. The first flow rate is, for example, 5 L/min or more and 50 L/min or less. The flow rate of the inert gas in the first preliminary replacement step means a total flow rate of the inert gas introduced from the plurality of first fluid introducing ports 10A into the first sealed processing space SP1.

In a state where the first sealed processing space SP1 is filled with the inert gas, an oxidizing fluid valve 63A is opened. Thereby, an ozone gas is introduced from the plurality of first fluid introducing ports 10A into the first sealed processing space SP1 and the ozone gas is supplied toward the first principal surface W1 of the substrate W (oxidizing gas supplying step, ozone gas supplying step: Step S13).

The first principal surface W1 of the substrate W is processed by the ozone gas ejected from the plurality of first fluid introducing ports 10A (oxidation processing step). Specifically, a gallium oxide layer constituted of one atomic layer or several atomic layers is formed on a surface layer of a gallium nitride layer exposed from the first principal surface W1 of the substrate W (metal oxide layer forming step, gallium oxide layer forming step). Introduction of the ozone gas into the first sealed processing space SP1 continues for a predetermined oxidation processing time. The predetermined oxidation processing time is, for example, 10 seconds or more and 120 seconds or less.

A flow rate of the oxidizing gas in the oxidizing gas supplying step is a predetermined oxidation flow rate. The oxidation flow rate is, for example, 5 L/min or more and 50 L/min or less. The flow rate of the oxidizing gas in the oxidizing gas supplying step means a total flow rate of the oxidizing gas introduced from all the first fluid introducing ports 10A into the first sealed processing space SP1.

During introduction of the oxidizing gas into the first sealed processing space SP1, a first inert gas flow rate adjusting valve 62B is controlled to adjust the flow rate of the inert gas to a first partial pressure adjusting flow rate. The first partial pressure adjusting flow rate is, for example, a second flow rate which is lower than the first flow rate. The second flow rate is, for example, 5 L/min or more and 50 L/min or less. The first partial pressure adjusting flow rate means a total flow rate of the inert gas introduced from the plurality of first fluid introducing ports 10A into the first sealed processing space SP1.

The flow rate of the inert gas is adjusted, by which a partial pressure of the ozone gas inside the first sealed processing space SP1 can be adjusted to a partial pressure which is suitable for oxidizing a portion of one atomic layer or several atomic layers on the surface layer of the gallium nitride layer (ozone gas partial pressure adjusting step, oxidizing gas partial pressure adjusting step).

Even during supply of the ozone gas, since a state where a first fluid discharge valve 67 is opened is kept, the ozone gas inside the first sealed processing space SP1 is exhausted from a first fluid discharge line 57.

After the first principal surface W1 of the substrate W is processed by the ozone gas, the oxidizing fluid valve 63A is closed. Thereby, while the inert gas is continuously ejected from the plurality of first fluid introducing ports 10A, ejection of the ozone gas is stopped.

The inert gas is supplied toward the principal surface of the substrate W, by which the atmosphere inside the first sealed processing space SP1 is replaced with the inert gas and the ozone gas is eliminated from the first sealed processing space SP1 (oxidizing gas eliminating step: Step S14).

At the same time when the oxidizing fluid valve 63A is closed or after the oxidizing fluid valve 63A is closed, the first inert gas flow rate adjusting valve 62B is controlled to change the flow rate of the inert gas to a predetermined oxidizing fluid eliminating flow rate. The oxidizing fluid eliminating flow rate is, for example, the first flow rate. The oxidizing fluid eliminating flow rate means a total flow rate of the inert gas introduced from the plurality of first fluid introducing ports 10A into the first sealed processing space SP1.

Thereafter, the substrate W which is oxidized is carried out from the first heat processing unit 5A (Step S15: first substrate carrying-out step).

The substrate W which has been carried out from the first heat processing unit 5A is carried into the second heat processing unit 5B by the transfer robot CR (Step S16: second substrate carrying-in step). The substrate W is placed on the heating surface 20a of the second hot plate 20B in a state where the first principal surface W1 is turned upward (second substrate placing step).

Thereafter, a lid 32 of the second heat processing chamber 30B is lowered, thereby giving a state where the substrate W is placed on a second hot plate 20B inside the second sealed processing space SP2 which is formed by a chamber main body 31 and the lid 32. The temperature of the substrate W placed on the heating surface 20a is adjusted to a predetermined etching temperature by the second hot plate 20B (temperature adjusting step). The predetermined etching temperature is, for example, a temperature which is 25° C. or higher and 100° C. or lower (low temperature heating step). The second hot plate 20B is an example of a second temperature adjusting member lower in temperature than the first temperature adjusting member, and the heating surface 20a of the second hot plate 20B is an example of a second temperature adjusting surface.

Where the substrate W to be carried into the second heat processing chamber 30B has already been cooled to a temperature lower than the etching temperature, the substrate W is placed on the heating surface 20a of the second hot plate 20B and, thereby, heated up to the etching temperature. In contrast, where the temperature of the substrate W to be carried into the second heat processing chamber 30B is higher than the etching temperature, the substrate W is placed on the heating surface 20a of the second hot plate 20B and, thereby, cooled down to the etching temperature.

In a state where the second sealed processing space SP2 is formed, a second fluid discharge valve 68 and a second inert gas valve 64A are opened. Thereby, while an inert gas is introduced from the plurality of second fluid introducing ports 10B into the second sealed processing space SP2, the atmosphere inside the second sealed processing space SP2 is discharged to the outside of the second heat processing chamber 30B via the plurality of second fluid discharge ports 15B. That is, before an oxidizing gas is supplied to the second sealed processing space SP2, the atmosphere inside the second sealed processing space SP2 is replaced with the inert gas (second preliminary replacement step: Step S17).

The inert gas is continuously supplied for a predetermined second replacement time, by which the atmosphere inside the second sealed processing space SP2 is sufficiently replaced with the inert gas and the second sealed processing space SP2 is filled with the inert gas. The predetermined second replacement time is, for example, 30 seconds. A flow rate of the inert gas (second preliminary replacement flow rate) in the second preliminary replacement step is, for example, 5 L/min or more and 50 L/min or less. The second preliminary replacement flow rate may be the first flow rate which is equal to the first preliminary replacement flow rate. The flow rate of the inert gas in the second preliminary replacement step means a total flow rate of the inert gas introduced from all the second fluid introducing ports 10B into the second sealed processing space SP2.

After the temperature of the substrate W has reached the etching temperature, a water valve 65A and a reactive gas valve 66A are opened. Thereby, an etching gas (mixed gas of steam and ammonia gas) is supplied from the plurality of second fluid introducing ports 10B to the second sealed processing space SP2 (etching gas supplying step: Step S18).

The first principal surface W1 of the substrate W is processed by the etching gas ejected from the plurality of second fluid introducing ports 10B (etching processing step). Specifically, a gallium oxide layer formed on the first principal surface W1 of the substrate W is etched to selectively remove the gallium oxide layer (metal oxide layer removing step, gallium oxide layer removing step). In the metal oxide layer removing step, in a state where the temperature of the substrate W is the etching temperature, the gallium oxide layer is etched (low temperature etching step).

Introduction of the etching gas into the second sealed processing space SP2 continues for a predetermined etching processing time. The predetermined etching processing time is, for example, 10 seconds or more and 120 seconds or less.

A flow rate of steam in the etching gas supplying step is a predetermined steam flow rate. The flow rate of steam is, for example, 5 L/min or more and 50 L/min or less. The flow rate of steam in the etching gas supplying step means a total flow rate of steam introduced from all the second fluid introducing ports 10B into the second sealed processing space SP2.

A flow rate of the ammonia gas in the etching gas supplying step is a predetermined ammonia flow rate. The flow rate of the ammonia gas is, for example, 5 L/min or more and 50 L/min or less. The flow rate of the ammonia gas in the etching gas supplying step means a total flow rate of the ammonia gas introduced from all the second fluid introducing ports 10B into the second sealed processing space SP2.

During the time when the etching gas is introduced from the plurality of second fluid introducing ports 10B into the second sealed processing space SP2, a second inert gas flow rate adjusting valve 64B is controlled to adjust the flow rate of the inert gas to a second partial pressure adjusting flow rate. The second partial pressure adjusting flow rate is lower than the preliminary replacement flow rate and, for example, the second flow rate. The second partial pressure adjusting flow rate means a total flow rate of the inert gas introduced from the plurality of second fluid introducing ports 10B into the second sealed processing space SP2.

The inert gas is decreased in flow rate, by which a partial pressure of steam and a partial pressure of the ammonia gas inside the second sealed processing space SP2 can be adjusted to a partial pressure which is suitable for selective etching of the gallium oxide layer (etching gas partial pressure adjusting step).

The temperature of steam ejected from the plurality of second fluid introducing ports 10B is higher than the temperature (etching temperature) of the substrate W in the etching gas supplying step. Therefore, the steam is lowered in temperature in the vicinity of the first principal surface W1 of the substrate W to produce water in a fine mist state. As long as a concentration of the ammonia gas dissolved into the water in a fine mist state is $1\times10^{-6}$ mol/L or more and 15 mol/L or less, it is possible to selectively etch the gallium oxide layer having a thickness of one atomic layer or several atomic layers. The concentration of the ammonia gas dissolved in the water in a fine mist is in particular preferably 1 mol/L.

After the gallium oxide layer is removed from the first principal surface W1 of the substrate W, while a state where the water valve 65A is opened is kept, the reactive gas valve 66A is closed. Thereby, introduction of the ammonia gas from the plurality of second fluid introducing ports 10B into the second sealed processing space SP2 is stopped and introduction of steam from the plurality of second fluid introducing ports 10B into the second sealed processing space SP2 continues (steam supply continuing step: Step S19). The steam is continuously supplied to the second sealed processing space SP2, thereby eliminating the reactive gas from the second sealed processing space SP2 (reactive gas eliminating step, ammonia gas eliminating step).

After supply of the reactive gas is stopped, the steam is continuously introduced into the second sealed processing space SP2 for a predetermined water continuous supply time. The predetermined water continuous supply time is, for example, 10 seconds or more and 120 seconds or less.

During the time when the steam is continuously supplied to the second sealed processing space SP2, a flow rate of the inert gas is adjusted to a predetermined ammonia gas eliminating flow rate. The ammonia gas eliminating flow rate is, for example, the second flow rate equal to the second partial pressure adjusting flow rate. The flow rate of the inert gas in the steam supply continuing step means a total flow rate of the inert gas introduced from the plurality of second fluid introducing ports 10B into the second sealed processing space SP2.

After supply of the steam has continued for the predetermined water continuous supply time, the water valve 65A is closed. Thereby, supply of the steam to the second sealed processing space SP2 is stopped. On the other hand, supply of the inert gas to the second sealed processing space SP2 continues, thereby, eliminating the steam from the second sealed processing space SP2 (water eliminating step, steam eliminating step: Step S20).

At the same time when the water valve 65A is closed or after the water valve 65A is closed, the flow rate of the inert gas is changed to a predetermined water eliminating flow rate. The water eliminating flow rate is, for example, the first flow rate. The flow rate of the inert gas in the water eliminating step means a total flow rate of the inert gas introduced from all the second fluid introducing ports 10B into the second sealed processing space SP2.

Thereafter, the first substrate carrying-in step (Step S11) to the second substrate carrying-out step (Step S21) may be again executed each at least once. "N" shown in FIG. 12 means an integer which is 0 or more (N=0, 1, 2 . . . ). The cycle processing is executed at least once in total and the substrate W which is etched is carried out to the outside of the second heat processing unit 5B (Step S21: second substrate carrying-out step). Thereafter, in the last step of the second substrate carrying-out step, the substrate W is delivered from the transfer robot CR to the transfer robot IR and housed in the carrier C by the transfer robot IR.

The second preferred embodiment can provide the same effects as the first preferred embodiment. However, according to the second preferred embodiment, the temperature of the substrate W is adjusted on the heating surface 20a of the first hot plate 20A and, thereafter, adjusted on the heating surface 20a of the second hot plate 20B. That is, the temperature is adjusted twice (for example, heating and cooling of the substrate W) by different members (first hot plate 20A and second hot plate 20B). Therefore, as compared with a configuration, like the first preferred embodiment, in which the heating surface 20a of the single hot plate 20 is changed in temperature to adjust the temperature of the substrate W, it is possible to shorten the time necessary for adjusting the temperature of the substrate W.

In the second preferred embodiment as well, the modified examples (refer to FIG. 8 and FIG. 9) of the first preferred embodiment are applicable. In this case, in the first substrate carrying-out step (Step S15) and the second substrate carrying-out step (Step S21), the substrate W is cooled down to an ordinary temperature by the cool plate 70, 81 before being carried out from the processing unit 2 by the transfer robot CR.

Other Preferred Embodiments

The present invention is not limited to the aforementioned preferred embodiments and can be implemented in still other embodiments.

For example, in the aforementioned preferred embodiments, steam is used in the metal oxide layer removing step. However, in the metal oxide layer removing step, as the etching fluid, a mixed fluid of steam, water in a mist state and a reactive gas may be used or a mixed fluid of water in a mist state and a reactive gas may be used.

However, in the case of steam contained in the etching gas ejected from the second fluid introducing ports 10B as in each of the aforementioned preferred embodiments, water in a bulk state (in a state of very small-sized droplets) is less likely to adhere to the first principal surface W1 of the substrate W than a case where water in a mist state is used. Accordingly, with a configuration in which steam is used as water contained in the etching gas, it is possible to make water molecules collide more evenly with each position of the first principal surface W1 of the substrate W.

Further, in the metal oxide forming step, the oxidizing gas such as an ozone gas is not necessarily required to be used, and an oxidizing liquid such as a hydrogen peroxide solution can be used. Where the oxidizing liquid is a hydrogen peroxide solution, a concentration of hydrogen peroxide in the hydrogen peroxide solution is preferably 1 ppm or more and 100 ppm or less. The oxidizing gas and the oxidizing liquid are collectively referred to as an oxidizing fluid.

In the metal oxide forming step, O radicals that are produced due to excitation of oxygen in air by UV irradiation may be used to form a metal layer. In the metal oxide forming step, O radicals produced by UV irradiation may be combined with an oxidizing fluid.

In the aforementioned preferred embodiments, the substrate processing apparatus 1, 1P is provided with the transfer robots IR, CR, the processing unit 2 and the controller 3. However, the single processing unit 2 may constitute the substrate processing apparatus of the present invention. In other words, the processing unit 2 may be an example of the substrate processing apparatus.

In each of the aforementioned preferred embodiments, an inert gas and an oxidizing gas pass through the common first fluid line 50 and are introduced from the first fluid introducing ports 10A into the heat processing chamber 30 (first heat processing chamber 30A), and an inert gas, steam and a reactive gas pass through the common second fluid line 51 and are introduced from the second fluid introducing ports 10B into the heat processing chamber 30 (second heat processing chamber 30B). However, each of the fluids may be fed to the fluid introducing port 10 from the inert gas line, the oxidizing gas line, the water line, the reactive gas line, etc., which are directly connected to the fluid introducing port 10, without passing through the common lines such as the first fluid line 50 and the second fluid line 51. Further, a mixing valve for mixing the fluids may be provided in the first fluid line 50 and the second fluid line 51.

It may also be configured so that each of the fluids is ejected from a nozzle provided inside the heat processing chamber 30 (first heat processing chamber 30A, second heat processing chamber 30B).

Further, an etching gas (etching fluid) is not required to be mixed inside the second fluid line 51, and the etching gas (etching fluid) that is mixed in advance may be supplied to the second fluid line 51, etc., from a supply source.

Where the temperature (etching temperature) of the substrate W in the metal oxide layer removing step is an ordinary temperature (for example, 25° C.), in the substrate processing of the first preferred embodiment, heating by the hot plate 20 may be stopped to lower the temperature of the substrate W.

Where the temperature (etching temperature) of the substrate W in the metal oxide layer removing step is an ordinary temperature (for example, 25° C.), no heating is needed by the second hot plate 20B in the substrate processing of the second preferred embodiment.

While the preferred embodiments of the present invention have been described in detail, these are merely specific examples used to clarify the technical content of the present invention, and the present invention should not be interpreted as being limited to these specific examples and the scope of the present invention shall be limited only by the attached claims.

The invention claimed is:

1. A substrate processing method for processing a substrate which has a metal layer on a principal surface, the substrate processing method comprising:
    a metal oxide layer forming step in which an oxidizing fluid is supplied toward the principal surface of the substrate, thereby forming a metal oxide layer constituted of one atomic layer or several atomic layers on a surface layer of the metal layer; and
    a metal oxide layer removing step in which an etching fluid containing at least one of water in a gaseous state and water in a mist state as well as a reactive gas that reacts with the metal oxide layer together with the water is supplied toward the principal surface of the substrate, thereby etching the metal oxide layer and selectively removing it from the substrate; and
    a reactive gas eliminating step in which after the metal oxide layer removing step, at least one of water in a gaseous state and water in a mist state is continuously supplied to the principal surface of the substrate, thereby eliminating the reactive gas from a space in contact with the principal surface of the substrate, wherein
    cycle processing in which the metal oxide layer forming step and the metal oxide layer removing step are given as one cycle is executed at least in one cycle, thereby controlling the etching amount of the metal layer for each cycle at an accuracy of a nanometer or less.

2. The substrate processing method according to claim 1 further comprising: a water eliminating step in which after the reactive gas eliminating step, water present in a space in contact with the principal surface of the substrate is replaced with an inert gas, thereby eliminating the water from the space in contact with the principal surface of the substrate.

3. The substrate processing method according to claim 1 further comprising: an oxidizing fluid eliminating step in which after the metal oxide layer forming step and also before the metal oxide layer removing step, an inert gas is supplied toward the principal surface of the substrate, by which the oxidizing fluid present in a space in contact with the principal surface of the substrate is replaced with the inert gas, thereby eliminating the oxidizing fluid from the space in contact with the principal surface of the substrate.

4. The substrate processing method according to claim 1, wherein
    the metal oxide layer removing step includes an etching fluid supplying step in which an etching fluid is supplied from an etching fluid supplying unit toward the principal surface of the substrate and a temperature adjusting step in which a temperature of the substrate is adjusted to a temperature lower than that of the etching fluid supplied from the etching fluid supplying unit.

5. The substrate processing method according to claim 1, wherein
    the metal oxide layer forming step includes a heating oxidation step in which while the substrate is heated, the oxidizing fluid is supplied toward the principal surface of the substrate, thereby forming the metal oxide layer, and
    the metal oxide layer removing step includes a low temperature etching step in which in a state where a temperature of the substrate is lower than the temperature of the substrate in the metal oxide layer forming step, the etching fluid is supplied toward the principal surface of the substrate, thereby etching the metal oxide layer.

6. The substrate processing method according to claim 5, wherein
the temperature of the substrate in the heating oxidation step is 100° C. or higher and 400° C. or lower and the temperature of the substrate in the low temperature etching step is 25° C. or higher and 100° C. or lower.

7. The substrate processing method according to claim 5, wherein
in the heating oxidation step, while the oxidizing fluid is supplied toward the principal surface of the substrate, the substrate is placed on a heating surface of a heating member disposed inside a chamber, thereby heating the substrate, and
in the low temperature etching step, while a state where the substrate is placed on the heating surface is kept, the heating member is lowered in temperature, thereby lowering the temperature of the substrate.

8. The substrate processing method according to claim 5, wherein
in the heating oxidation step, while the oxidizing fluid is supplied toward the principal surface of the substrate, the substrate is placed on a first temperature adjusting surface of a first temperature adjusting member disposed inside a first chamber, thereby heating the substrate, and
in the low temperature etching step, the substrate is moved from the first temperature adjusting surface and the substrate is placed on a second temperature adjusting surface of a second temperature adjusting member which is disposed inside a second chamber and is lower in temperature than the first temperature adjusting member, thereby lowering the temperature of the substrate.

9. The substrate processing method according to claim 1, wherein
a thickness of the metal oxide layer formed in the metal oxide layer forming step is 5 nm or less.

10. The substrate processing method according to claim 1, wherein
the metal layer includes a metal nitride layer containing a Group III metal.

11. The substrate processing method according to claim 10, wherein
the metal nitride layer is a gallium nitride layer.

12. The substrate processing method according to claim 1, wherein
water contained in the etching fluid is water in a gaseous state.

13. The substrate processing method according to claim 1, wherein
the reactive gas is an ammonia gas.

* * * * *